US008860709B2

(12) United States Patent
Sugiyama et al.

(10) Patent No.: US 8,860,709 B2
(45) Date of Patent: Oct. 14, 2014

(54) LEVEL CONVERTING CIRCUIT, DISPLAY DEVICE, AND ELECTRONIC APPARATUS

(75) Inventors: Takaaki Sugiyama, Kanagawa (JP); Genichiro Oga, Kanagawa (JP)

(73) Assignee: Sony Corporation, Tokyo (JP)

( * ) Notice: Subject to any disclaimer, the term of this patent is extended or adjusted under 35 U.S.C. 154(b) by 586 days.

(21) Appl. No.: 13/200,714

(22) Filed: Sep. 29, 2011

(65) Prior Publication Data

US 2012/0086696 A1 Apr. 12, 2012

(30) Foreign Application Priority Data

Oct. 8, 2010 (JP) ................. P2010-228896

(51) Int. Cl.
*G09G 5/10* (2006.01)
*H03K 19/0185* (2006.01)

(52) U.S. Cl.
CPC ............. *H03K 19/018521* (2013.01)
USPC .......................... 345/212; 345/690

(58) Field of Classification Search
CPC ............ G09G 5/00; G09G 5/10; G09G 3/30; G09G 3/36
USPC ............................ 345/690, 212, 76
See application file for complete search history.

(56) References Cited

U.S. PATENT DOCUMENTS

| 2005/0231238 | A1* | 10/2005 | Chang | 326/81 |
| 2009/0167747 | A1* | 7/2009 | Gong et al. | 345/212 |
| 2010/0265277 | A1* | 10/2010 | Takahara | 345/690 |
| 2011/0130981 | A1* | 6/2011 | Chaji et al. | 702/58 |
| 2012/0075282 | A1* | 3/2012 | Higashijima et al. | 345/212 |

FOREIGN PATENT DOCUMENTS

| JP | 2003-101405 | 4/2003 |
| JP | 2005-311712 | 11/2005 |
| JP | 2006-019815 | 1/2006 |

* cited by examiner

*Primary Examiner* — Quan-Zhen Wang
*Assistant Examiner* — Yuk Chow
(74) *Attorney, Agent, or Firm* — Rader, Fishman & Grauer PLLC

(57) ABSTRACT

A level converting circuit includes a level converting part and a bias part. The level converting part includes at least first to fourth n-type field effect transistors and first and second p-type field effect transistors. The bias part includes a fifth n-type field effect transistor, a voltage drop part including at least one resistive element, and a current source having a power-supply-side terminal connected to a voltage source of a voltage higher than a first voltage. The bias part generates a bias voltage higher than the first voltage by the threshold voltage of the first and second n-type field effect transistors or a bias voltage that is higher than the first voltage and lower than the threshold voltage at the side of one end of the resistive element, and supplies the bias voltage to the gates of the first and second n-type field effect transistors in the level converting part.

17 Claims, 18 Drawing Sheets

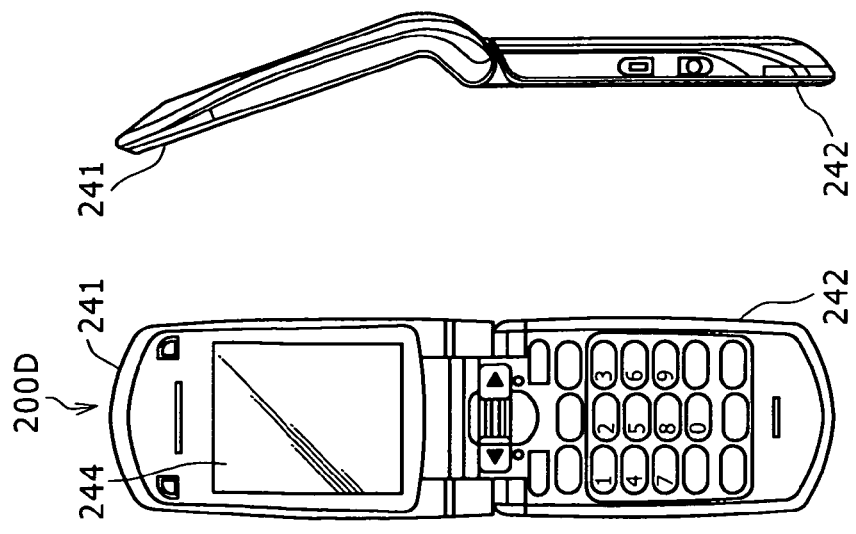
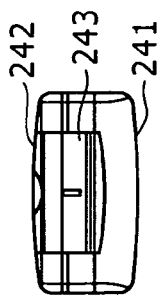
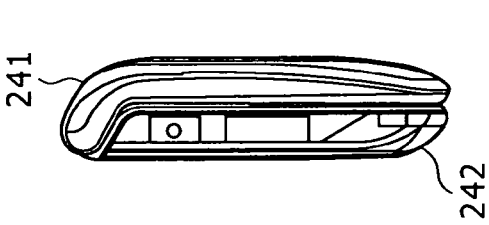
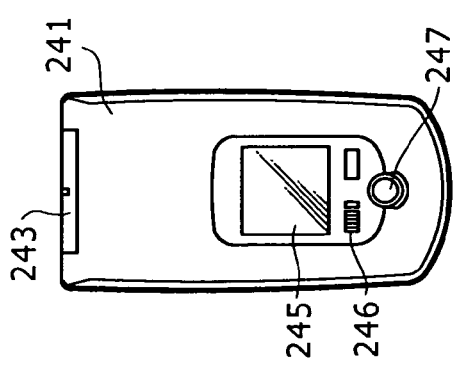
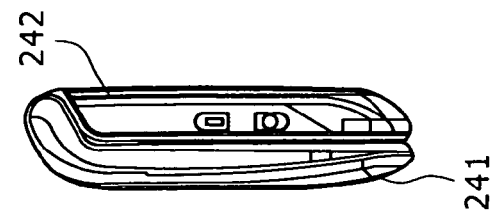
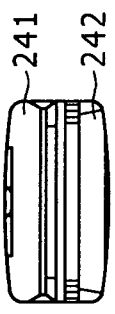
FIG.18A FIG.18B FIG.18C FIG.18D FIG.18E FIG.18F FIG.18G

LEVEL CONVERTING CIRCUIT, DISPLAY DEVICE, AND ELECTRONIC APPARATUS

BACKGROUND

The present disclosure relates to a level converting circuit for level conversion of the voltage level of an input signal, a display device, and electronic apparatus using it.

The level converting circuit (level shift circuit) converts e.g. an input signal whose signal level is the level of the ground potential GND and the level of a first voltage (low supply voltage LVDD) to the signal level of a second voltage (high supply voltage HVDD) higher than the ground potential GND and the first voltage.

Because the level converting circuit uses the high supply voltage HVDD, a high-breakdown-voltage transistor needs to be used. The existing level converting circuits (level shifters) are all configured by using the high-breakdown-voltage transistor.

However, in recent years, along with a decrease in the breakdown voltage, it becomes difficult to supply a sufficiently-high overdrive voltage ov to the gate of a high-breakdown-voltage NMOS transistor and thus the level converting circuit is obliged to have an increased area for capability enhancement.

In such circumstances, there have been proposed techniques of supplying a bias higher than the low supply voltage LVDD to the gate of a high-breakdown-voltage NMOS transistor and carrying out level conversion with use of a low-voltage power supply for speed enhancement, area reduction, and stable operation (refer to e.g. Japanese Patent Laid-open No. 2006-19815, Japanese Patent Laid-open No. 2005-311712, and Japanese Patent Laid-open No. 2003-101405 (hereinafter, Patent Documents 1 to 3, respectively)).

FIG. 1 is a circuit diagram showing the configuration of a level converting circuit disclosed in Patent Document 1.

A level converting circuit 1 of FIG. 1 has n-type field effect transistors (NMOS transistors) NT1 to NT7 and p-type field effect transistors (PMOS transistors) PT1 to PT3.

The NMOS transistors NT1, NT2, and NT5 and the PMOS transistors PT1 to PT3 are formed of high-breakdown-voltage MOS transistors. The NMOS transistors NT3, NT4, NT6, and NT7 are formed of low-breakdown-voltage MOS transistors.

The level converting circuit 1 has an input terminal T1 to which an input signal of 0 to 5 V is applied, a low-voltage (5 V) power supply terminal T2, a ground terminal T3, a high-voltage power supply terminal T4, inverters IV1 and IV2 that operate by a low-voltage power supply, an inverter IV3 for a high-voltage power supply, and an output terminal T5.

In the level converting circuit 1, the gate voltage of the PMOS transistor PT3 forming a bias circuit 2 is so set that its source-drain current is kept at 3 μA. The transistor characteristics of the PMOS transistor PT3 forming the bias circuit 2 and the NMOS transistor NT5 are set identical to those of the PMOS transistor PT1 and the NMOS transistor NT1. The circuit of the transistor NT5 and the circuit of the transistor NT1 configure a current mirror circuit.

Due to this feature, the source voltage of the NMOS transistor NT1 is the same as that of the NMOS transistor NT5 and kept at 5 V. This applies also to the circuit of the PMOS transistor PT2 and the NMOS transistor NT2.

The drain voltage of the NMOS transistors NT3 and NT4 is equal to or lower than the voltage of the low-voltage power supply terminal T2. As a result, a large current is permitted to flow as the source-drain current of the NMOS transistors NT3 and NT4 even when the voltage of the low-voltage power supply terminal T2 is lowered, and driving by a lower input signal is enabled.

FIG. 2 is a circuit diagram showing the configuration of a level converting circuit disclosed in Patent Document 2.

For easy understanding, the same constituent part in a level converting circuit 1A of FIG. 2 as that in FIG. 1 is represented by the same symbol.

In the level converting circuit 1A of FIG. 2, the current flowing in a bias circuit 2A is controlled by a control signal EN obtained by inverting a control signal ENX from the external by an inverter IV6.

FIG. 3 is a circuit diagram showing the configuration of a level converting circuit disclosed in Patent Document 3.

For easy understanding, the same constituent part in a level converting circuit 1B of FIG. 3 as that in FIG. 1 and FIG. 2 is represented by the same symbol.

In the level converting circuit 1B of FIG. 3, a bias circuit (intermediate voltage generating circuit) 2B is formed as a source follower circuit and configured with a PMOS transistor PT8 and a resistor R2.

SUMMARY

In all of the techniques shown in FIG. 1 to FIG. 3, the lowering of the operating speed associated with the lowering of the supply voltage can be prevented in the level shift operation.

However, problems such as increase in the power consumption, addition of a control signal, and increase in the area occur. The cause of the problems is that a bias voltage supplied to the level converting part (level shift part) can be properly designed in none of these techniques.

In the level converting circuit 1 of FIG. 1, a steady current flows also in the period other than the period of the level shift operation. That is, the level converting circuit 1 of FIG. 1 is configured as a circuit designed at the expense of power consumption reduction.

In the level converting circuit 1A of FIG. 2, although a steady current does not flow when the circuit is not operating by the control signal, circuit and signal for the control are necessary.

Furthermore, a steady current flows also in the level converting part that is not operating when another level converting part is turned on.

In the level converting circuit 1B of FIG. 3, a reasonable bias voltage can be given to the level converting part used. Furthermore, the flow of a steady current when the circuit is not operating and when another level converting part is turned on can be prevented.

However, the level converting circuit 1B of FIG. 3 has several problems.

Specifically, for example, variation in the set voltage of the high-voltage-side power supply and process variation between the voltage of the PMOS transistor PT8, which uses a voltage as the source follower in the bias circuit, and the NMOS transistor used for the level converting part have to be considered.

To solve these problems, the level converting circuit is obliged to have an increased area.

There is a desire for a technique to provide a level converting circuit that can prevent increase in the complexity of the circuit configuration, increase in the power consumption, and the lowering of the characteristics and is allowed to achieve reduction in the layout area, a display device, and electronic apparatus using it.

According to an embodiment of the present disclosure, there is provided a level converting circuit including a level converting part configured to receive supply of a bias voltage and convert an input signal whose signal level is the levels of a reference voltage and a first voltage to the signal level of a second voltage higher than the reference voltage and the first voltage, and a bias part configured to generate the bias voltage and supply the bias voltage to the level converting part. The level converting part includes at least a first n-type field effect transistor, a second n-type field effect transistor, a third n-type field effect transistor, a fourth n-type field effect transistor, a first p-type field effect transistor, and a second p-type field effect transistor. The drain of the first n-type field effect transistor is connected to the drain of the first p-type field effect transistor and the gate of the second p-type field effect transistor, and the first n-type field effect transistor has the source connected to the drain of the third n-type field effect transistor and has the gate connected to a supply source of the bias voltage. The drain of the second n-type field effect transistor is connected to the drain of the second p-type field effect transistor and the gate of the first p-type field effect transistor, and the second n-type field effect transistor has the source connected to the drain of the fourth n-type field effect transistor and has the gate connected to the supply source of the bias voltage. The source of the first p-type field effect transistor and the source of the second p-type field effect transistor are connected to a second voltage source. The source of the third n-type field effect transistor and the source of the fourth n-type field effect transistor are connected to a reference voltage source. An input signal that takes a reference voltage level and a first voltage level in a complementary manner is supplied to the gate of the third n-type field effect transistor and the gate of the fourth n-type field effect transistor. The bias part includes a fifth n-type field effect transistor, a voltage drop part including at least one resistive element, and a current source having a power-supply-side terminal connected to a voltage source of a voltage higher than the first voltage. The fifth n-type field effect transistor has the source connected to a first voltage source and has the drain connected to one end of the resistive element. The other end of the resistive element is connected to the current supply terminal side of the current source. The gate of the fifth n-type field effect transistor is connected to the side of the other end of the resistive element. The bias part generates the bias voltage higher than the first voltage by the threshold voltage of the first n-type field effect transistor and the second n-type field effect transistor or the bias voltage that is higher than the first voltage and lower than the threshold voltage at the side of one end of the resistive element, and supplies the bias voltage to the gate of the first n-type field effect transistor and the gate of the second n-type field effect transistor in the level converting part.

According to another embodiment of the present disclosure, there is provided a display device including a display part configured to have display cells disposed in a matrix manner, and a signal line drive circuit configured to include a level converting circuit that converts an input signal to a level depending on a drive level and drive a signal line connected to the display cell by a drive signal generated by using a level-converted signal. The level converting circuit in the signal line drive circuit includes at least one level converting part that receives supply of a bias voltage and converts an input signal whose signal level is the levels of a reference voltage and a first voltage to the signal level of a second voltage higher than the reference voltage and the first voltage, and a bias part that generates the bias voltage and supplies the bias voltage to the level converting part. The level converting part includes at least a first n-type field effect transistor, a second n-type field effect transistor, a third n-type field effect transistor, a fourth n-type field effect transistor, a first p-type field effect transistor, and a second p-type field effect transistor. The drain of the first n-type field effect transistor is connected to the drain of the first p-type field effect transistor and the gate of the second p-type field effect transistor, and the first n-type field effect transistor has the source connected to the drain of the third n-type field effect transistor and has the gate connected to a supply source of the bias voltage. The drain of the second n-type field effect transistor is connected to the drain of the second p-type field effect transistor and the gate of the first p-type field effect transistor, and the second n-type field effect transistor has the source connected to the drain of the fourth n-type field effect transistor and has the gate connected to the supply source of the bias voltage. The source of the first p-type field effect transistor and the source of the second p-type field effect transistor are connected to a second voltage source. The source of the third n-type field effect transistor and the source of the fourth n-type field effect transistor are connected to a reference voltage source. An input signal that takes a reference voltage level and a first voltage level in a complementary manner is supplied to the gate of the third n-type field effect transistor and the gate of the fourth n-type field effect transistor. The bias part includes a fifth n-type field effect transistor, a voltage drop part including at least one resistive element, and a current source having a power-supply-side terminal connected to a voltage source of a voltage higher than the first voltage. The fifth n-type field effect transistor has the source connected to a first voltage source and has the drain connected to one end of the resistive element. The other end of the resistive element is connected to the current supply terminal side of the current source. The gate of the fifth n-type field effect transistor is connected to the side of the other end of the resistive element. The bias part generates the bias voltage higher than the first voltage by the threshold voltage of the first n-type field effect transistor and the second n-type field effect transistor or the bias voltage that is higher than the first voltage and lower than the threshold voltage at the side of one end of the resistive element, and supplies the bias voltage to the gate of the first n-type field effect transistor and the gate of the second n-type field effect transistor in the level converting part.

According to another embodiment of the present disclosure, there is provided an electronic apparatus having a display device. The display device includes a display part configured to have display cells disposed in a matrix manner, and a signal line drive circuit configured to include a level converting circuit that converts an input signal to a level depending on a drive level and drive a signal line connected to the display cell by a drive signal generated by using a level-converted signal. The level converting circuit in the signal line drive circuit includes at least one level converting part that receives supply of a bias voltage and converts an input signal whose signal level is the levels of a reference voltage and a first voltage to the signal level of a second voltage higher than the reference voltage and the first voltage, and a bias part that generates the bias voltage and supplies the bias voltage to the level converting part. The level converting part includes at least a first n-type field effect transistor, a second n-type field effect transistor, a third n-type field effect transistor, a fourth n-type field effect transistor, a first p-type field effect transistor, and a second p-type field effect transistor. The drain of the first n-type field effect transistor is connected to the drain of the first p-type field effect transistor and the gate of the second p-type field effect transistor, and the first n-type field effect transistor has the source connected to the drain of the third n-type field effect transistor and has the gate connected to a supply source of the bias voltage. The drain of the second n-type field effect transistor is connected to the drain of the second p-type field effect transistor and the gate of the first p-type field effect transistor, and the second n-type field effect transistor has the source connected to the drain of the fourth n-type field effect transistor and has the gate connected to the supply source of the bias voltage. The source of the first p-type field effect transistor and the source of the second p-type field effect transistor are connected to a second voltage source. The source of the third n-type field effect transistor and the source of the fourth n-type field effect transistor are connected to a reference voltage source. An input signal that takes a reference voltage level and a first voltage level in a complementary manner is supplied to the gate of the third n-type field effect transistor and the gate of the fourth n-type field effect transistor. The bias part includes a fifth n-type field effect transistor, a voltage drop part including at least one resistive element, and a current source having a power-supply-side terminal connected to a voltage source of a voltage higher than the first voltage. The fifth n-type field effect transistor has the source connected to a first voltage source and has the drain connected to one end of the resistive element. The other end of the resistive element is connected to the current supply terminal side of the current source. The gate of the fifth n-type field effect transistor is connected to the side of the other end of the resistive element. The bias part generates the bias voltage higher than the first voltage by the threshold voltage of the first n-type field effect transistor and the second n-type field effect transistor or the bias voltage that is higher than the first voltage and lower than the threshold voltage at the side of one end of the resistive element, and supplies the bias voltage to the gate of the first n-type field effect transistor and the gate of the second n-type field effect transistor in the level converting part.

The embodiments of the present disclosure can prevent increase in the complexity of the circuit configuration, increase in the power consumption, and the lowering of the characteristics and be allowed to achieve reduction in the layout area.

BRIEF DESCRIPTION OF THE DRAWINGS

FIGS. 18A to 18G are diagrams showing a portable terminal device to which the embodiment is applied, specifically e.g. a cellular phone.

DETAILED DESCRIPTION OF THE PREFERRED EMBODIMENTS

Embodiments of the present disclosure will be described in detail below in association with the drawings.

The order of the description is as follows.
1. First Embodiment (first configuration example of level converting circuit)
2. Second Embodiment (second configuration example of level converting circuit)
3. Third Embodiment (third configuration example of level converting circuit)
4. Fourth Embodiment (fourth configuration example of level converting circuit)
5. Fifth Embodiment (fifth configuration example of level converting circuit)
6. Sixth Embodiment (sixth configuration example of level converting circuit)
7. Seventh Embodiment (seventh configuration example of level converting circuit)
8. Configuration Example of Display Device
9. Configuration Example of Signal Line Drive Circuit
10. Configuration Example of Electronic Apparatus <1. First Embodiment>

Figure 1:
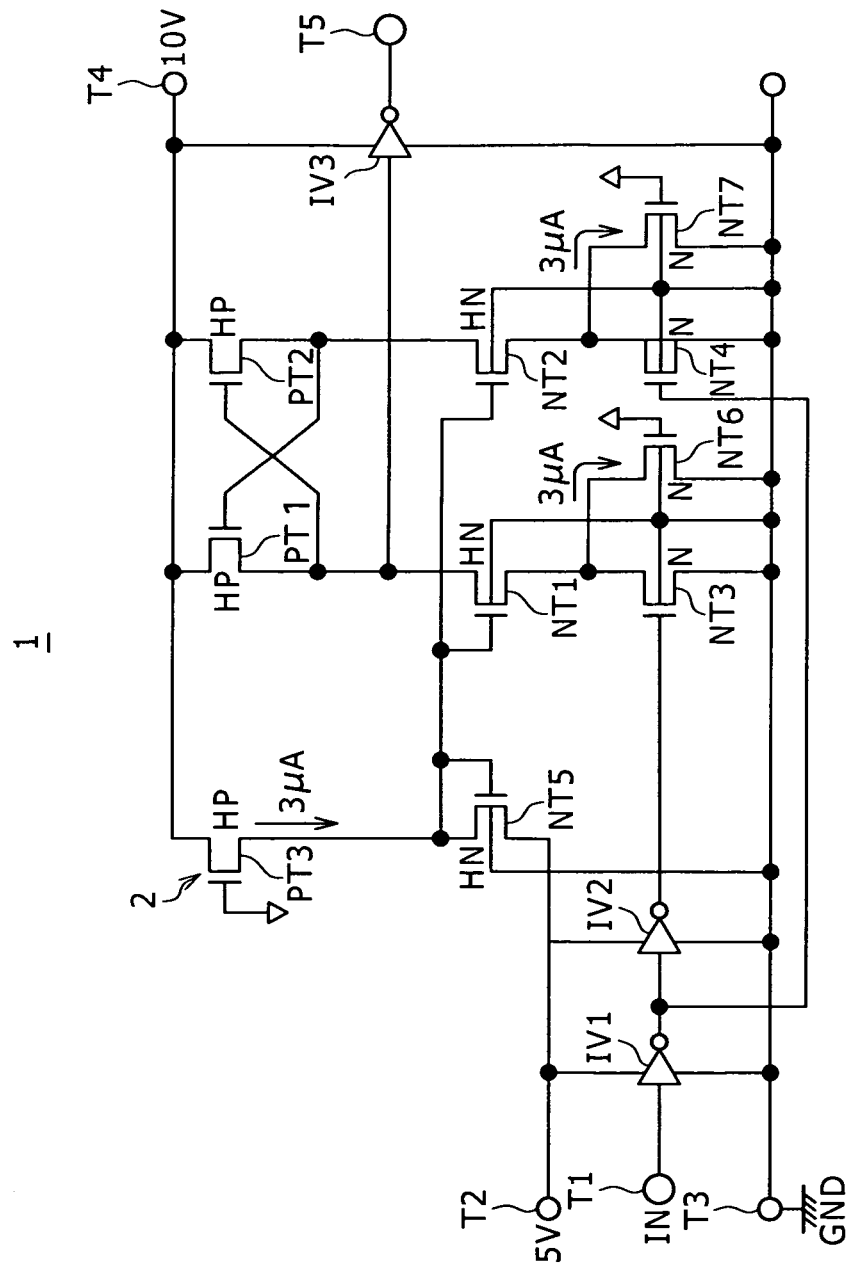
FIG. 1 is a circuit diagram showing the configuration of a level converting circuit disclosed in Patent Document 1.
Figure 2:
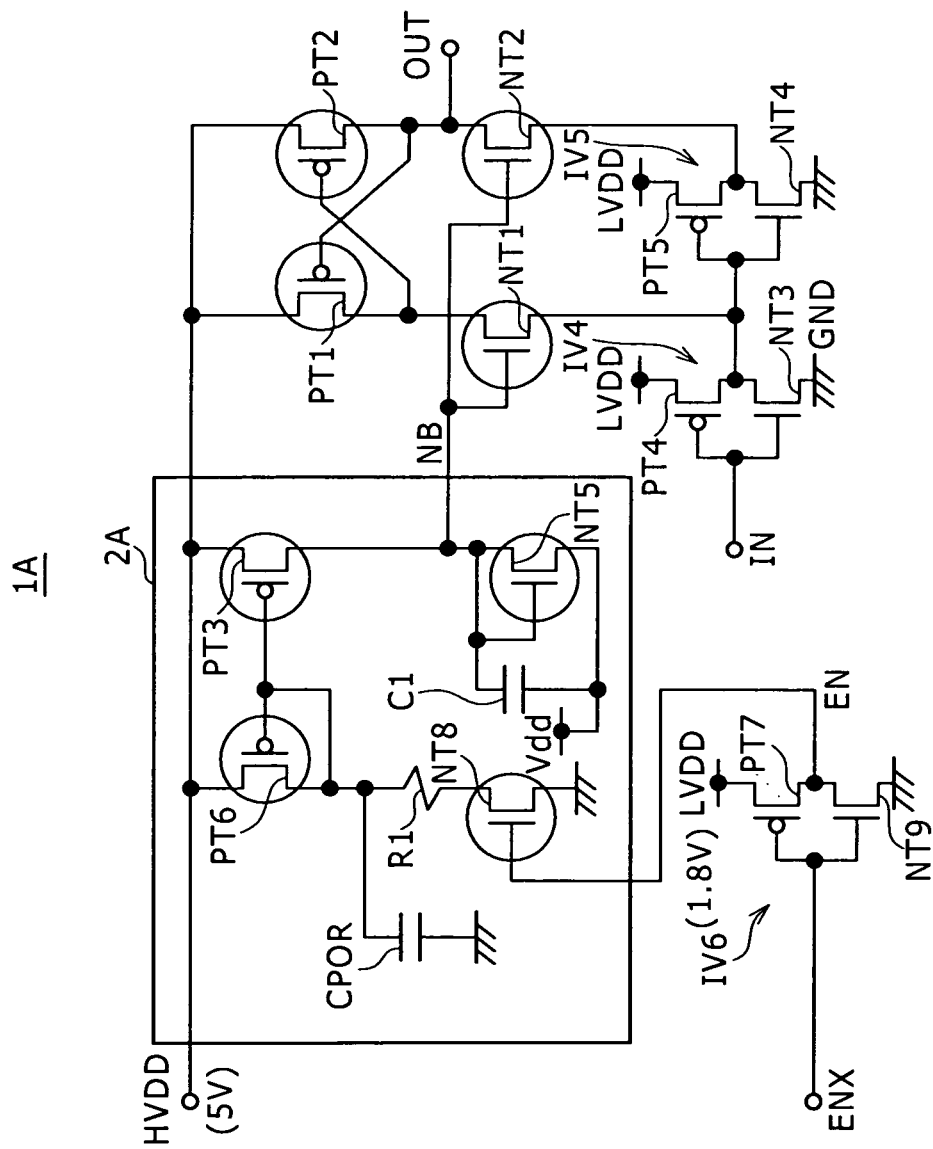
FIG. 2 is a circuit diagram showing the configuration of a level converting circuit disclosed in Patent Document 2.
Figure 3:
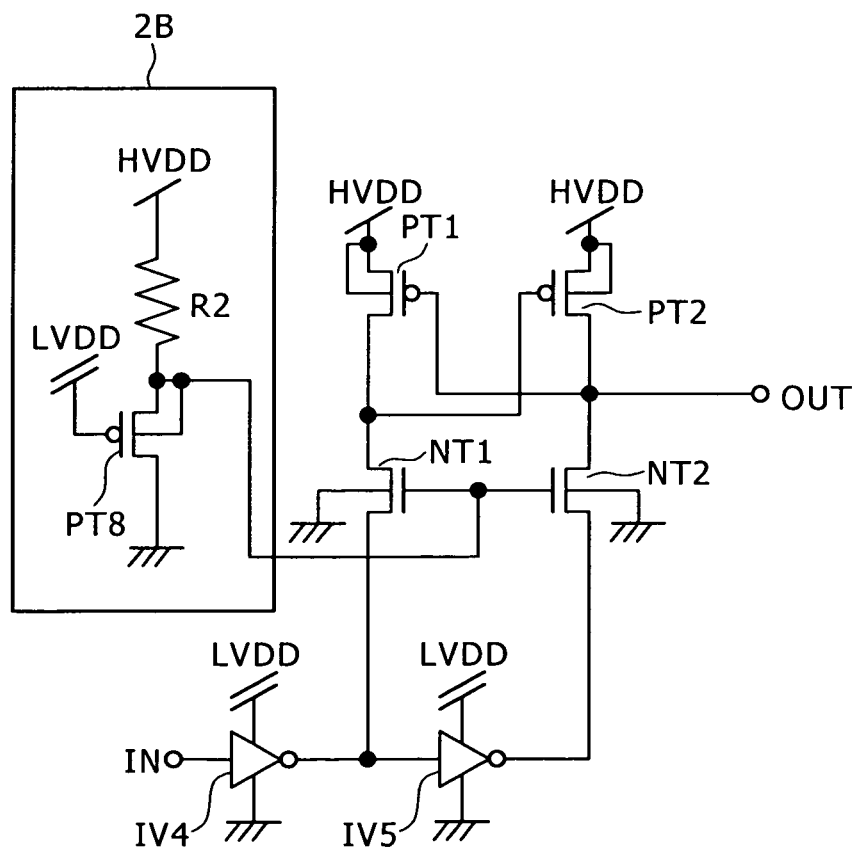
FIG. 3 is a circuit diagram showing the configuration of a level converting circuit disclosed in patent document 3.
Figure 4:
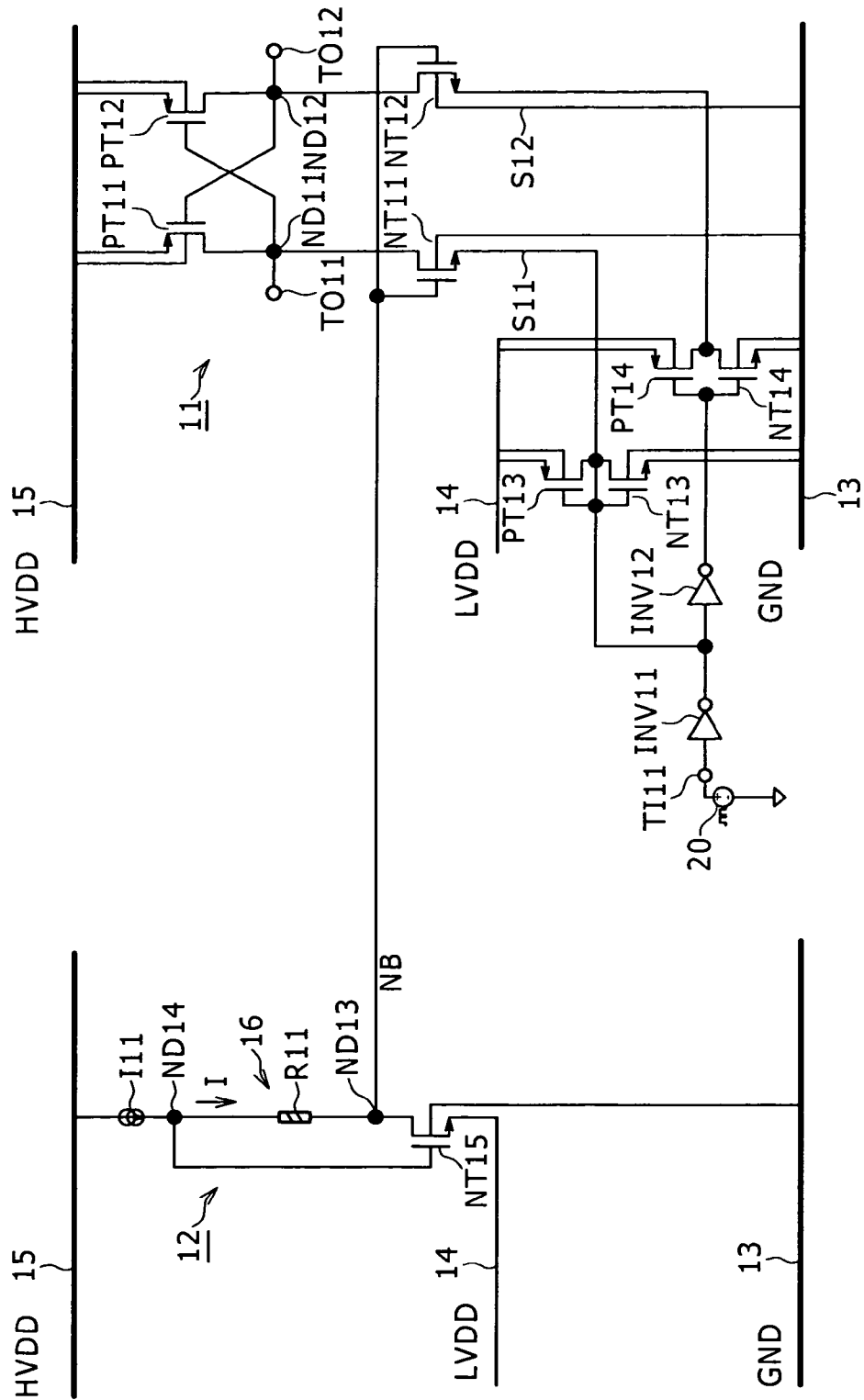
FIG. 4 is a circuit diagram showing a configuration example of a level converting circuit according to a first embodiment of the present disclosure.

FIG. 4 is a circuit diagram showing a configuration example of a level converting circuit according to a first embodiment of the present disclosure.

As shown in FIG. 4, a level converting circuit 10 according to the first embodiment includes a level converting part (level shifter part) 11 and a bias part 12. In FIG. 4, numeral 20 denotes a signal power supply.

The level converting part 11 converts an input signal SIN whose signal level is the levels of a reference voltage and a first voltage from the signal supply 20 to the signal level of a second voltage higher than the reference voltage and the first voltage with reception of supply of a bias voltage NB by the bias part 12, and outputs the converted signal level.

In the present embodiment, as one example, the reference voltage is a ground potential GND (0 V). The first voltage is a low supply voltage LVDD, e.g. 1.8 V. The second voltage is a high supply voltage HVDD, e.g. 18 V.

In FIG. 4, a reference voltage source (ground potential source) is represented by numeral 13. A first voltage source (low supply voltage source) is represented by numeral 14. A second voltage source (high supply voltage source) is represented by numeral 15.

The "high-breakdown-voltage" refers to such a characteristic that n-type and p-type field effect transistors can exert their functions even by a high voltage (in the present example, about 18 V) without influence on their gate insulating films.

The "low-breakdown-voltage" refers to such a characteristic that n-type and p-type field effect transistors can exert their functions by a low voltage (in the present example, about 1.8 V) without influence on their gate insulating films.

The level converting part 11 has a first NMOS transistor NT11, a second NMOS transistor NT12, a third NMOS transistor NT13, and a fourth NMOS transistor NT14.

The level converting part 11 has a first PMOS transistor PT11, a second PMOS transistor PT12, a third PMOS transistor PT13, and a fourth PMOS transistor PT14.

The level converting part 11 has inverters INV11 and INV12, an input terminal TI11, and output terminals TO11 and TO12.

Of these constituent elements, the first NMOS transistor NT11, the second NMOS transistor NT12, the first PMOS transistor PT11, and the second PMOS transistor PT12 are formed of high-breakdown-voltage MOS transistors.

The third NMOS transistor NT13, the fourth NMOS transistor NT14, the third PMOS transistor PT14, and the fourth PMOS transistor PT14 are formed of low-breakdown-voltage MOS transistors.

The inverters INV11 and INV12 are configured as inverters for low supply voltage operation.

Although the configuration in which two output terminals TO11 and TO12 are provided is shown in the present example, a configuration in which either one of them is provided as the output terminal can also be employed.

The first NMOS transistor NT11 is equivalent to the first n-type field effect transistor, and the second NMOS transistor NT12 is equivalent to the second n-type field effect transistor.

The third NMOS transistor NT13 is equivalent to the third n-type field effect transistor, and the fourth NMOS transistor NT14 is equivalent to the fourth n-type field effect transistor.

The first PMOS transistor PT11 is equivalent to the first p-type field effect transistor, and the second PMOS transistor PT12 is equivalent to the second p-type field effect transistor.

The third PMOS transistor PT13 is equivalent to the third p-type field effect transistor, and the fourth PMOS transistor PT14 is equivalent to the fourth p-type field effect transistor.

In the level converting part 11, the drain of the first NMOS transistor NT11 is connected to the drain of the first PMOS transistor PT11 and the gate of the second PMOS transistor PT12, and this connection node forms a node ND11. The node ND11 is connected to the output terminal TO11.

The source of the first NMOS transistor NT11 is connected to the drain of the third NMOS transistor NT13 and the drain of the third PMOS transistor PT13, and the gate is connected to the supply source of the bias voltage NB (bias part 12).

The drain of the second NMOS transistor NT12 is connected to the drain of the second PMOS transistor PT12 and the gate of the first PMOS transistor PT11, and this connection node forms a node ND12. The node ND12 is connected to the output terminal T012.

The source of the second NMOS transistor NT12 is connected to the drain of the fourth NMOS transistor NT14 and the drain of the fourth PMOS transistor PT14, and the gate is connected to the supply source of the bias voltage NB (bias part 12).

The source and back gate of the first PMOS transistor PT11 and the source and back gate of the second PMOS transistor PT12 are connected to the second voltage source (high supply voltage source) 15.

The source and back gate of the third PMOS transistor PT13 and the source and back gate of the fourth PMOS transistor PT14 are connected to the first voltage source (low supply voltage source) 14.

The source and back gate of the third NMOS transistor NT13 and the source and back gate of the fourth NMOS transistor NT14 are connected to the reference voltage source (ground potential source) 13.

The back gate of the first NMOS transistor NT11 and the back gate of the second NMOS transistor NT12 are connected to the reference voltage source (ground potential source) 13.

The input terminal of the inverter INV11 is connected to the input terminal TI11 of the signal, and the output terminal is connected to the gate of the third PMOS transistor PT13, the gate of the third NMOS transistor NT13, and the input terminal of the inverter INV12.

The output terminal of the inverter INV12 is connected to the gate of the fourth PMOS transistor PT14 and the gate of the fourth NMOS transistor NT14.

Based on this configuration, to the gate of the third PMOS transistor PT13 and the gate of the third NMOS transistor NT13, the signal obtained by inverting the input signal SIN, whose signal level is the levels of the reference voltage and the first voltage, from the signal source 20 by the inverter INV11 is supplied.

To the gate of the fourth PMOS transistor PT14 and the gate of the fourth NMOS transistor NT14, the signal obtained by further inverting the inverted signal from the inverter INV11 by the inverter INV12 is supplied.

That is, the signal that takes the GND and LVDD levels in a complementary manner is supplied to the gates of the third PMOS transistor PT13 and the third NMOS transistor NT13 and the gates of the fourth PMOS transistor PT14 and the fourth NMOS transistor NT14.

The bias part 12 generates the bias voltage NB used for level conversion processing by the level converting part 11 and supplies this bias voltage NB to the gates of the first NMOS transistor NT11 and the second NMOS transistor NT12 in the level converting part 11.

The bias part 12 includes a fifth NMOS transistor NT15, a resistive element R11 forming a voltage drop part 16, and a current source I11 whose power-supply-side terminal TV is connected to the second voltage source 15.

The fifth NMOS transistor NT15 is equivalent to the fifth n-type field effect transistor.

The voltage source to which the current source I11 is connected is not limited to the second voltage source, and the current source I11 may be connected to an arbitrary voltage source as long as it is e.g. the voltage source having a voltage higher than the first voltage by several voltages.

The source of the fifth NMOS transistor NT15 is connected to the first voltage source (low supply voltage source) 14. The drain is connected to one end of the resistive element R11 and this connection node forms a supply node (supply source) ND13 of the bias voltage NB.

The other end of the resistive element R11 is connected to a current supply terminal TS of the current source I11 and this connection node forms a node ND14.

The gate of the fifth NMOS transistor NT15 is connected to the node ND14, which is on the other-end side of the resistive element R11.

The bias part 12 having such a configuration generates the bias voltage NB higher than the first voltage LVDD by the threshold voltage Vth of the first NMOS transistor NT11 and the second NMOS transistor NT12 at the node ND13, which is on the one-end side of the resistive element R11.

Furthermore, the bias part 12 generates the bias voltage NB that is higher than the first voltage LVDD and is lower than the above-described voltage higher than the first voltage LVDD by the threshold voltage Vth of the first NMOS transistor NT11 and the second NMOS transistor NT12 at the node ND13, which is on the one-end side of the resistive element R11.

The bias part 12 generates the bias voltage NB by causing the current flowing to the drain of the fifth NMOS transistor NT15 to flow through the resistive element R11 and thereby dropping the voltage.

The node ND13 as the supply source of this bias voltage is connected to the gate of the first NMOS transistor NT11 and the gate of the second NMOS transistor NT12 in the level converting part 11.

The threshold voltage Vth of the first NMOS transistor NT11, the second NMOS transistor NT12, and the fifth NMOS transistor NT15, which are high-breakdown-voltage transistors, is about 1 V.

As described above, in the present embodiment, the bias part 12 generates the bias voltage NB higher than the supply voltage LVDD (e.g. 1.8 V) of the digital circuit by approximately the threshold voltage Vth of the high-breakdown-voltage NMOS transistors (NB≈LVDD+Vth). Furthermore, the bias part 12 supplies the generated bias potential NB to the gate of the first NMOS transistor NT11 and the gate of the second NMOS transistor NT12 in the level converting part 11.

If the potential is output as it is with the diode configuration like the related art, the bias output voltage is {LVDD+Vth+ov}. ov denotes the overdrive voltage, which depends on the transistor size and the amount of current, which are transistor characteristics.

Due to this overdrive voltage ov generated in the bias part, the overdrive voltage ov arises also at the NMOS transistors NT11 and NT12 in the level converting part 11 when these transistors are in the off-state, so that the current depending on the size and the overdrive voltage ov flows.

Alternatively, it is necessary to prepare a control signal to shift the bias point so that the transistors may be prevented from operating when they are not being used.

In contrast, in the present embodiment, the voltage is dropped by the resistive element R11 and thereby the voltage resulting from subtraction of the overdrive voltage ov can be supplied to the level converting part 11.

The relational expression is as follows:

LVDD+Vth+ov−IR≈LVDD+Vth

In this manner, the voltage is so subjected to IR drop that the generated overdrive voltage ov is cancelled out. I denotes the current of the current source I11 and R denotes the resistance of the resistive element R11.

Specifically, the parameters are so designed as to satisfy a relationship ov<IR.

Due to this feature, a voltage that is equivalent to or lower than the threshold voltage can be applied to the NMOS transistors NT11 and NT12 in the level converting part 11 when these transistors are in the off-state, so that no current flows in the normal state.

The operation of the level converting circuit 10 according to the first embodiment will be described below with focus on the operation of the level converting part.

First, the case in which the input signal SIN supplied to the input terminal TI11 is at the low (L) level (ground level, 0 V) will be described.

The input signal SIN is inverted by the inverter INV11 and is supplied to the gate of the third PMOS transistor PT13 and the gate of the third NMOS transistor NT13 as a signal at the high (H) level (LVDD).

This sets the third PMOS transistor PT13 to the non-conductive state and sets the third NMOS transistor NT13 to the conductive state. As a result, the source S11 of the first NMOS transistor NT11 is electrically connected to the reference voltage source 13 via the third NMOS transistor NT13 and is shifted to the L level (0 V).

At this time, to the gate of the first NMOS transistor NT11, the bias voltage NB that is so set as to satisfy a relationship LVDD<NB≤(LVDD+Vth) is supplied from the bias part 12. This bias voltage NB is subjected to IR drop across the resistive element R11 as the voltage drop part in the bias part 12 so that the overdrive voltage ov generated attributed to the transistor may be cancelled out. Therefore, the bias voltage NB is so supplied that the influence of the overdrive voltage ov is offset.

In this case, the gate-source voltage VGS of the first NMOS transistor NT11 is higher than the threshold voltage Vth and thus the first NMOS transistor NT11 is set to the conductive state. Accordingly, the node ND11 is shifted to the L level (0 V).

Thereby, the input signal SIN at the ground level is output from the output terminal TO11, with its ground level kept.

The H-level signal arising from the inversion by the inverter INV11 is inverted by the inverter INV12 and is supplied to the gate of the fourth PMOS transistor PT14 and the gate of the fourth NMOS transistor NT14 as an L-level signal.

This sets the fourth PMOS transistor PT14 to the conductive state and sets the fourth NMOS transistor NT14 to the non-conductive state. As a result, the source S12 of the second NMOS transistor NT12 is electrically connected to the first voltage source (source of the low supply voltage LVDD) 14 via the fourth PMOS transistor PT14 and is shifted to the H level (LVDD).

At this time, to the gate of the second NMOS transistor NT12, the bias voltage NB that is so set as to satisfy the relationship LVDD<NB≤(LVDD+Vth) is supplied from the bias part 12. This bias voltage NB is subjected to IR drop across the resistive element R11 as the voltage drop part in the bias part 12 so that the overdrive voltage ov generated attributed to the transistor may be cancelled out. Therefore, the bias voltage NB is so supplied that the influence of the overdrive voltage ov is offset.

In this case, the gate-source voltage VGS of the second NMOS transistor NT12 is lower than the threshold voltage Vth and thus the second NMOS transistor NT12 is set to the non-conductive state.

In association with the transition of the node ND11 to the L level, the second PMOS transistor PT12 is set to the conductive state, and the node ND12 is electrically connected to the second voltage source (source of the high supply voltage HVDD) 15 and is shifted to the second voltage level (HVDD level).

Thereby, the input signal SIN at the ground level is converted to the second voltage level and output from the output terminal TO12.

Furthermore, in association with the transition of the node ND12 to the second voltage level (HVDD level), the first PMOS transistor PT11 is set to the non-conductive state, and the node ND11 is stably kept at the ground level.

As a result, the second PMOS transistor PT12 is stably kept at the conductive state and the output node ND12 is stably kept at the second voltage level (HVDD level).

Next, the case in which the input signal SIN supplied to the input terminal TI11 is at the H level (LVDD level) will be described.

The input signal SIN is inverted by the inverter INV11 and is supplied to the gate of the third PMOS transistor PT13 and the gate of the third NMOS transistor NT13 as a signal at the L level (ground level).

This sets the third PMOS transistor PT13 to the conductive state and sets the third NMOS transistor NT13 to the non-conductive state. As a result, the source S11 of the first NMOS transistor NT11 is electrically connected to the first voltage source (source of the low supply voltage LVDD) 14 via the third PMOS transistor PT13 and is shifted to the H level (LVDD level).

At this time, to the gate of the first NMOS transistor NT11, the bias voltage NB that is so set as to satisfy the relationship LVDD<NB≤(LVDD+Vth) is supplied from the bias part 12. This bias voltage NB is subjected to IR drop across the resistive element R11 as the voltage drop part in the bias part 12 so that the overdrive voltage ov generated attributed to the transistor may be cancelled out. Therefore, the bias voltage NB is so supplied that the influence of the overdrive voltage ov is offset.

In this case, the gate-source voltage VGS of the first NMOS transistor NT11 is lower than the threshold voltage Vth and thus the first NMOS transistor NT11 is set to the non-conductive state.

The L-level signal arising from the inversion by the inverter INV11 is inverted by the inverter INV12 and is supplied to the gate of the fourth PMOS transistor PT14 and the gate of the fourth NMOS transistor NT14 as an H-level signal.

This sets the fourth PMOS transistor PT14 to the non-conductive state and sets the fourth NMOS transistor NT14 to the conductive state. As a result, the source S12 of the second NMOS transistor NT12 is electrically connected to the reference voltage source (ground potential) 13 via the fourth NMOS transistor NT14 and is shifted to the L level (ground level).

At this time, to the gate of the second NMOS transistor NT12, the bias voltage NB that is so set as to satisfy the relationship LVDD<NB≤(LVDD+Vth) is supplied from the bias part 12. This bias voltage NB is subjected to IR drop across the resistive element R11 as the voltage drop part in the bias part 12 so that the overdrive voltage ov generated attributed to the transistor may be cancelled out. Therefore, the bias voltage NB is so supplied that the influence of the overdrive voltage ov is offset.

In this case, the gate-source voltage VGS of the second NMOS transistor NT12 is higher than the threshold voltage Vth and thus the second NMOS transistor NT12 is set to the conductive state. Accordingly, the node ND12 is shifted to the L level (ground level, 0 V).

Thereby, the input signal SIN at the first voltage level (LVDD level, H level) is converted to the ground level and output from the output terminal TO12.

In association with the transition of the node ND12 to the L level, the first PMOS transistor PT11 is set to the conductive state, and the node ND11 is electrically connected to the second voltage source (source of the high supply voltage HVDD) 15 and is shifted to the second voltage level (HVDD level).

Thereby, the input signal SIN at the LVDD level (H level) is converted to the second voltage level (HVDD level) and output from the output terminal TO11.

Furthermore, in association with the transition of the node ND11 to the second voltage level (HVDD level), the second PMOS transistor PT12 is stably kept at the non-conductive state and the output node ND12 is stably kept at the L level (ground level, 0 V).

As described above, in the first embodiment, the bias voltage NB is subjected to IR drop across the resistive element R11 as the voltage drop part in the bias part 12 so that the overdrive voltage ov generated attributed to the transistor may be cancelled out. Therefore, the bias voltage NB is so supplied that the influence of the overdrive voltage ov is offset.

Accordingly, the bias voltage NB that is not affected by the overdrive voltage ov and satisfies the relationship LVDD<NB≤(LVDD+Vth) can be supplied to the gates of the first NMOS transistor NT11 and the second NMOS transistor NT12.

Furthermore, in the level converting circuit 10 according to the first embodiment, a large current can be made to flow when the polarity of the input signal SIN is inverted, and a steady current does not flow. Therefore, a current does not flow in the period other than the period of the level shift operation, so that the power consumption can be reduced.

In addition, because the steady current does not flow, an excess control signal is unnecessary and control circuit and signal that work only at the time of operation are unnecessary.

Moreover, it is possible to prevent the flow of the steady current in the level converting part that is not operating when another level converting part is turned on.

Furthermore, because a source follower circuit or the like is not used, there is no need to consider variation in the set voltage of the high-voltage-side power supply and process variation between the transistor in the bias part and the NMOS transistors NT11 and NT12 used in the level converting part.

As a result, increase in the layout area can be prevented and therefore reduction in the layout area can be achieved.

<2. Second Embodiment>

Figure 5:
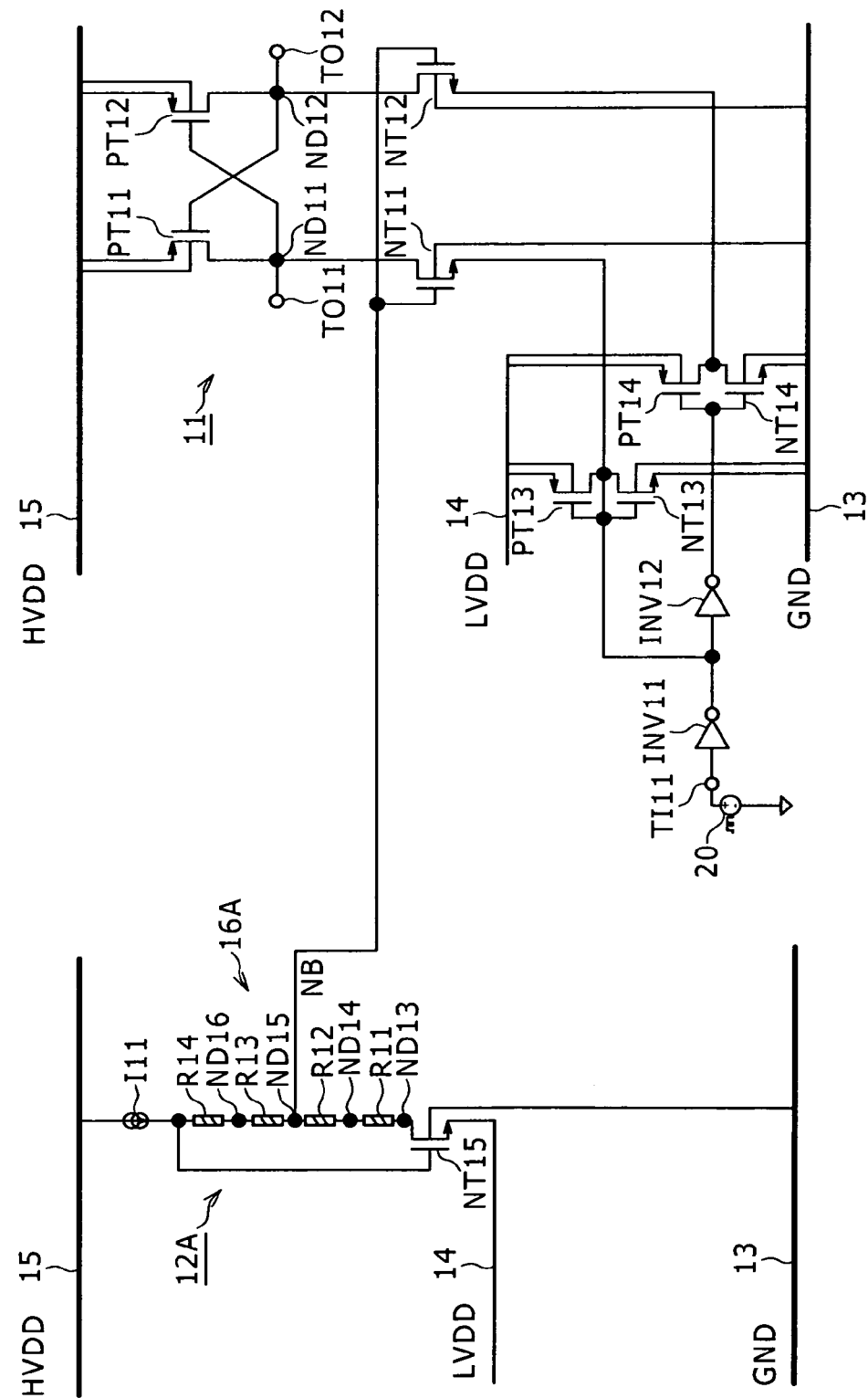
FIG. 5 is a circuit diagram showing a configuration example of a level converting circuit according to a second embodiment of the present disclosure.

FIG. 5 is a circuit diagram showing a configuration example of a level converting circuit according to a second embodiment of the present disclosure.

A level converting circuit 10A according to the second embodiment is different from the level converting circuit 10 according to the first embodiment in that a voltage drop part 16A is composed of plural resistive elements R11 to R14 connected in series.

Nodes ND13 to ND16 are formed by the connection node between the one-end side of the resistive element R11 and the drain of the fifth NMOS transistor NT15 and the connection nodes among the resistive elements R11 to R14 connected in series.

The node ND13 is formed by the connection node between one end of the resistive element R11 and the drain of the fifth NMOS transistor NT15. The node ND14 is formed by the connection node between the other end of the resistive element R11 and one end of the resistive element R12. The node ND15 is formed by the connection node between the other end of the resistive element R12 and one end of the resistive element R13. The node ND16 is formed by the connection node between the other end of the resistive element R13 and one end of the resistive element R14. The other end of the resistive element R14 is connected to the current source I11 and the gate of the fifth NMOS transistor NT15.

One of these nodes ND13 to ND16 can be used as the output node of the bias voltage NB obtained by resistor division.

In the example of FIG. 5, the node ND15 formed by the connection node between the other end of the resistive element R12 and one end of the resistive element R13 is used as the output node.

In the second embodiment, the other configuration is the same as that in the above-described first embodiment.

The second embodiment can achieve the same advantageous effects as those of the above-described first embodiment.

<3. Third Embodiment>

Figure 6:
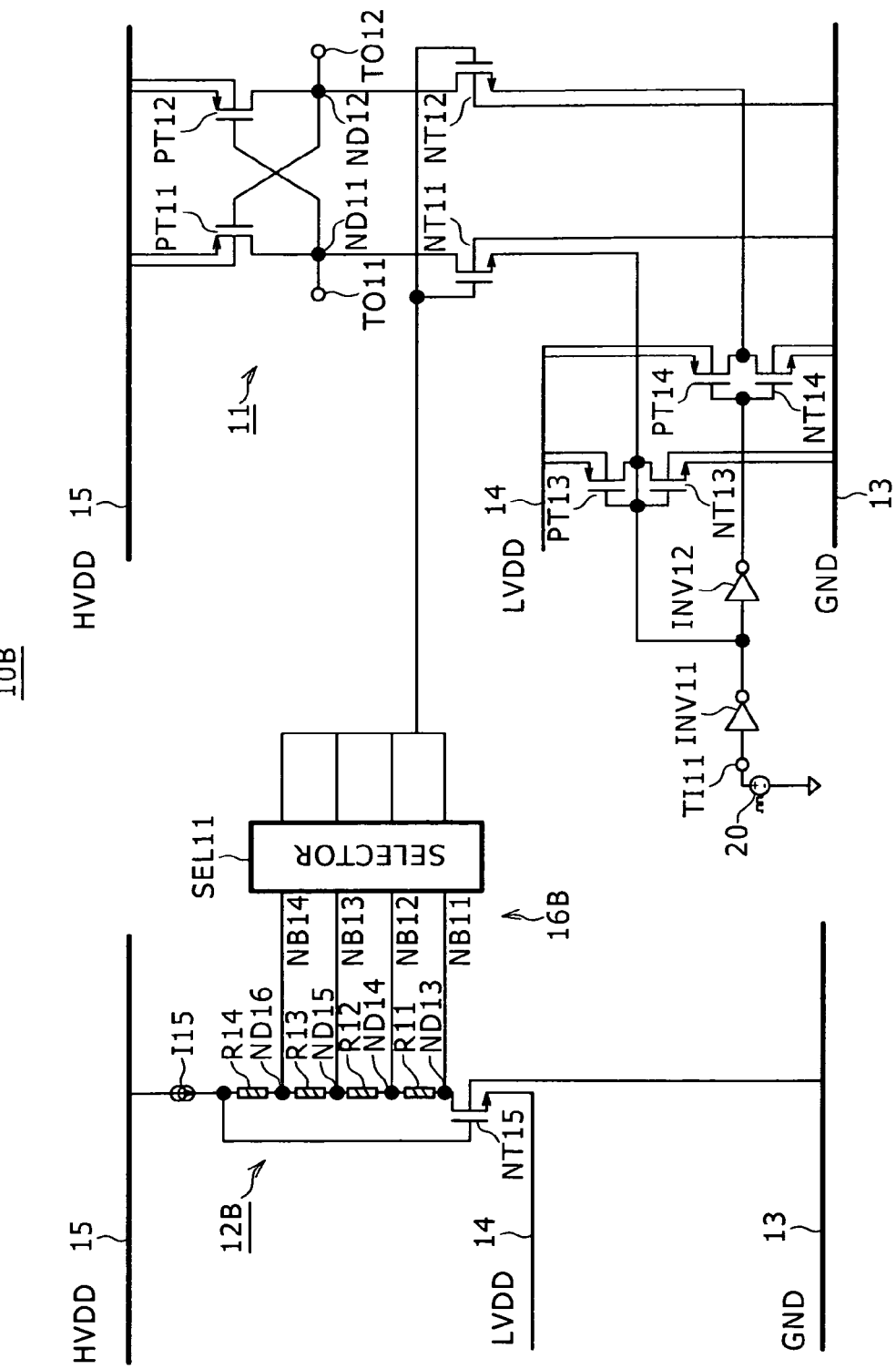
FIG. 6 is a circuit diagram showing a configuration example of a level converting circuit according to a third embodiment of the present disclosure.

FIG. 6 is a circuit diagram showing a configuration example of a level converting circuit according to a third embodiment of the present disclosure.

A level converting circuit 10B according to the third embodiment is different from the level converting circuit 10A according to the second embodiment in the following point.

In the level converting circuit 10B, the outputs of the nodes ND13 to ND16 are extracted as bias voltages NB11, NB12, NB13, and NB14 and the supply lines of these voltages are connected to a selector SEL11 so that the voltage can be accordingly selected.

One of the bias voltages NB11, NB12, NB13, and NB14 selected by the selector SEL11 is supplied to the gates of the first NMOS transistor NT11 and the second NMOS transistor NT12 in a level converting part 11B.

In the third embodiment, the other configuration is the same as that in the above-described second embodiment.

The third embodiment can achieve the same advantageous effects as those of the above-described first and second embodiments, and can realize supply of the optimum bias voltage to the level converting part.

<4. Fourth Embodiment>

Figure 7:
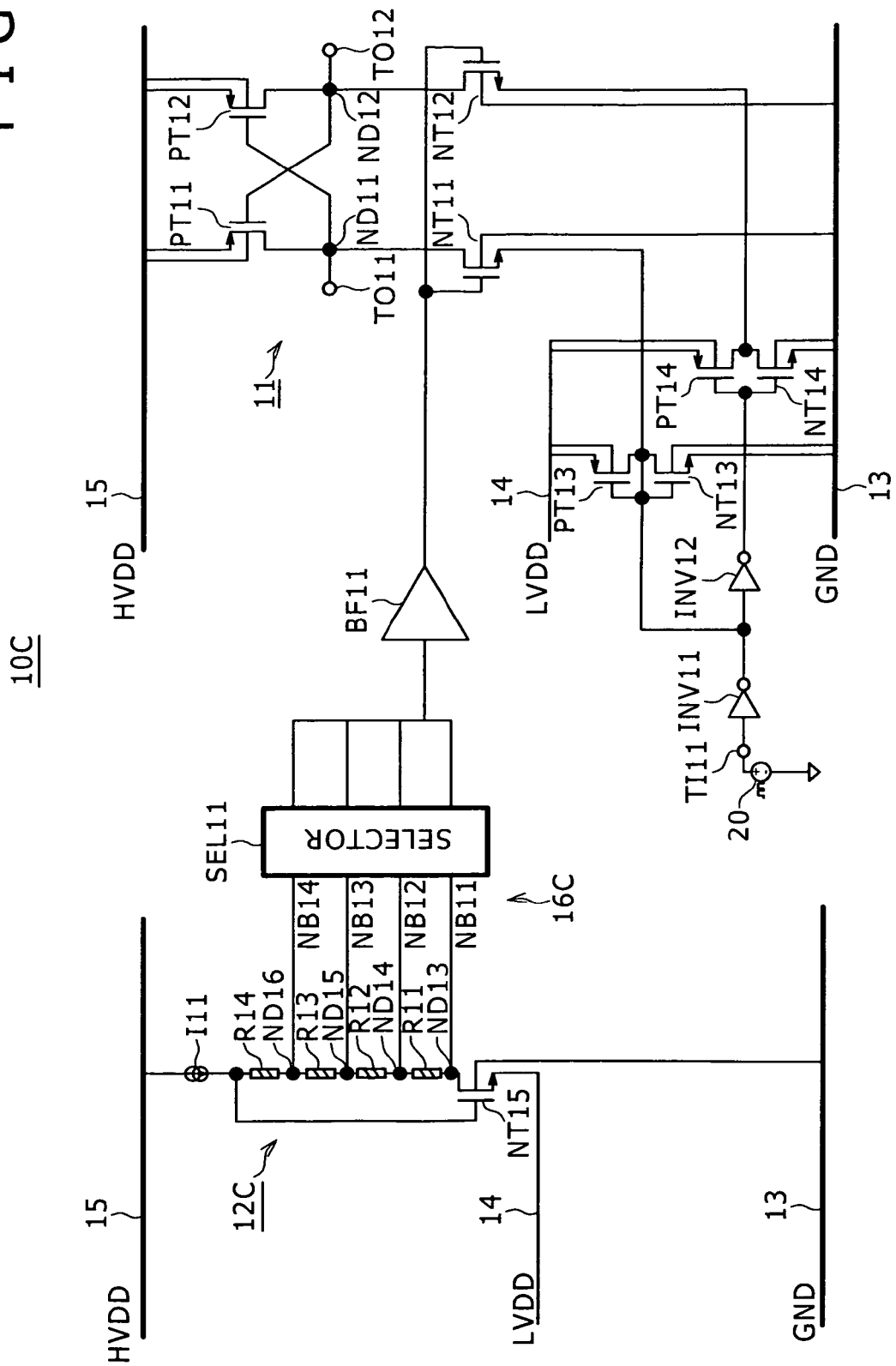
FIG. 7 is a circuit diagram showing a configuration example of a level converting circuit according to a fourth embodiment of the present disclosure.

FIG. 7 is a circuit diagram showing a configuration example of a level converting circuit according to a fourth embodiment of the present disclosure.

A level converting circuit 10C according to the fourth embodiment is different from the level converting circuit 10B according to the third embodiment in that a buffer BF11 is disposed on the output side of the selector SEL11.

In the fourth embodiment, the other configuration is the same as that in the above-described third embodiment.

The fourth embodiment can achieve the same advantageous effects as those of the above-described third embodiment.

<5. Fifth Embodiment>

Figure 8:
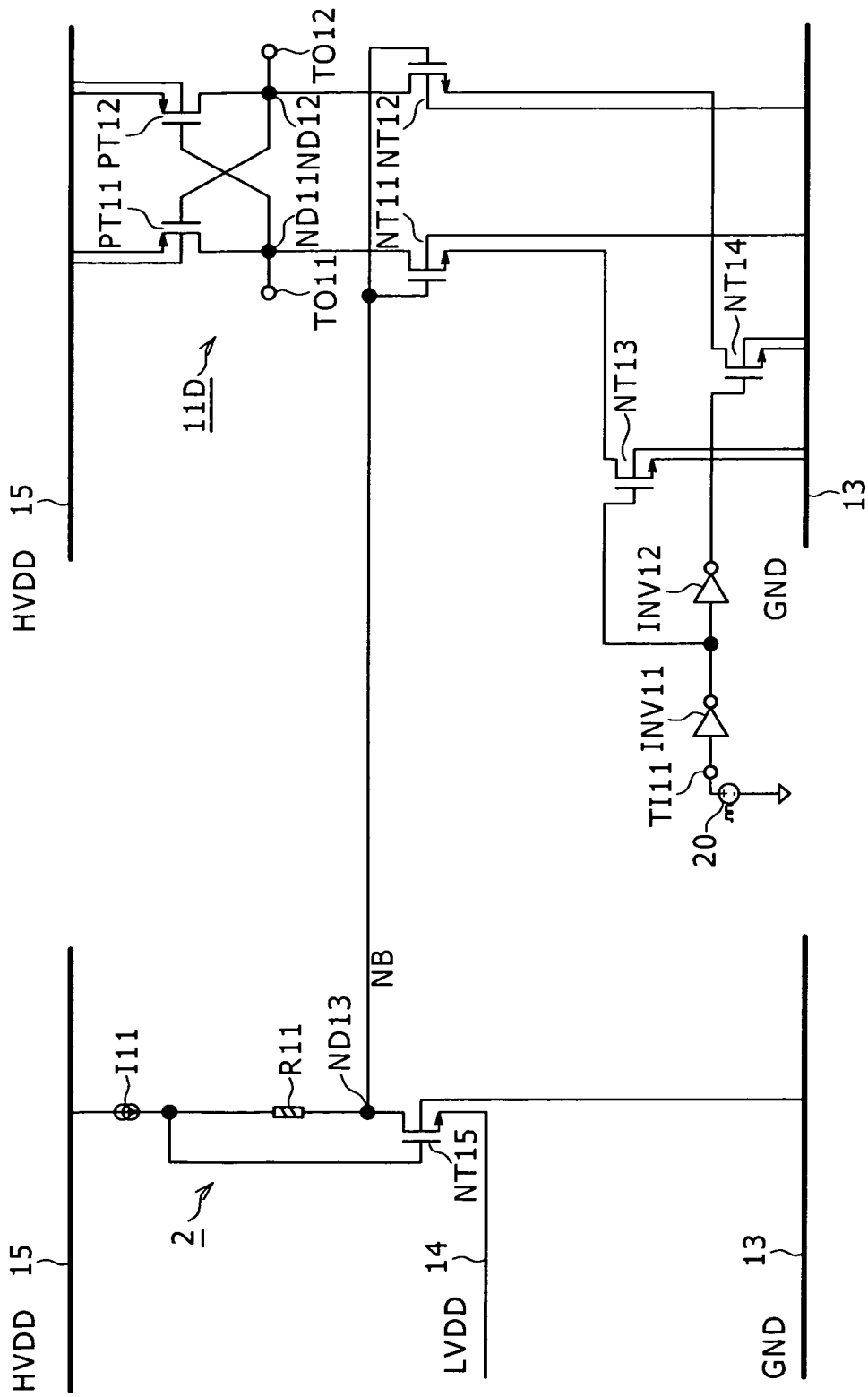
FIG. 8 is a circuit diagram showing a configuration example of a level converting circuit according to a fifth embodiment of the present disclosure.

FIG. 8 is a circuit diagram showing a configuration example of a level converting circuit according to a fifth embodiment of the present disclosure.

A level converting circuit 10D according to the fifth embodiment is different from the level converting circuit 10 according to the first embodiment in that the third PMOS transistor PT13 and the fourth PMOS transistor PT14 are omitted in a level converting part 11D.

In the fifth embodiment, the other configuration is the same as that in the above-described first embodiment.

The fifth embodiment can achieve the same advantageous effects as those of the above-described first embodiment.

<6. Sixth Embodiment>

Figure 9:
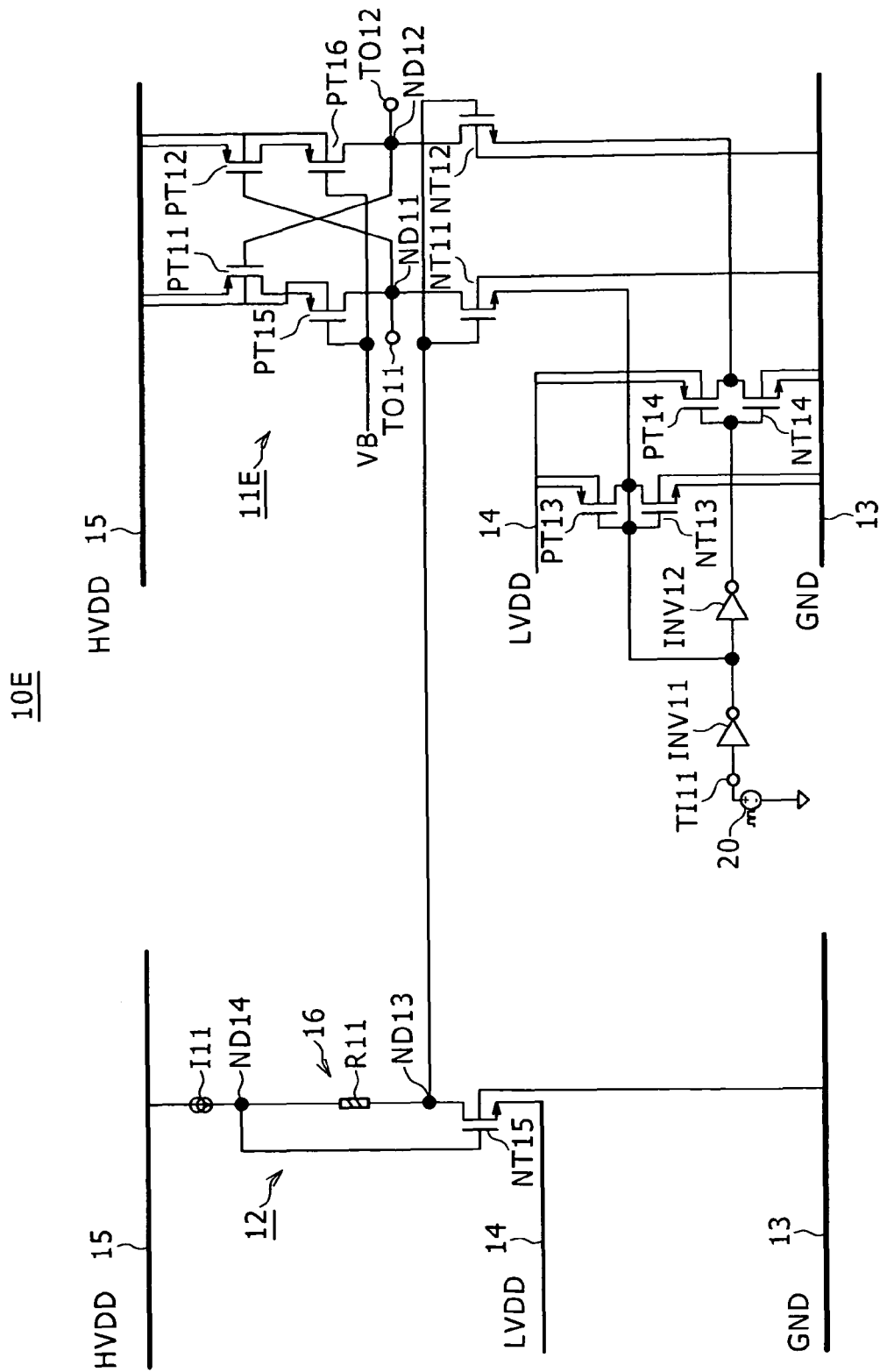
FIG. 9 is a circuit diagram showing a configuration example of a level converting circuit according to a sixth embodiment of the present disclosure.

FIG. 9 is a circuit diagram showing a configuration example of a level converting circuit according to a sixth embodiment of the present disclosure.

A level converting circuit 10E according to the sixth embodiment is different from the level converting circuit 10 according to the first embodiment in that a fifth PMOS transistor PT15 and a sixth PMOS transistor PT16 are added in a level converting part 11E.

The drain of the fifth PMOS transistor PT15 is connected to the drain of the first NMOS transistor NT11, and this connection node forms the node ND11. The source of the fifth PMOS transistor PT15 is connected to the drain of the first PMOS transistor PT11, and the back gate is connected to the second voltage source (source of the high supply voltage HVDD) 15.

The drain of the sixth PMOS transistor PT16 is connected to the drain of the second NMOS transistor NT12, and this connection node forms the node ND12. The source of the sixth PMOS transistor PT16 is connected to the drain of the second PMOS transistor PT12, and the back gate is connected to the second voltage source (source of the high supply voltage HVDD) 15.

To the gate of the fifth PMOS transistor PT15 and the gate of the sixth PMOS transistor PT16, a bias voltage VB generated by a bias part (not shown) is supplied.

The fifth PMOS transistor PT15 and the sixth PMOS transistor PT16 are disposed in order to receive the bias voltage VB at their gates and adjust the amount of current flowing to the nodes ND11 and ND12 so that level conversion (level shift) can be adequately carried out.

In the sixth embodiment, the other configuration is the same as that in the above-described first embodiment.

The sixth embodiment can achieve the same advantageous effects as those of the above-described first embodiment, and can realize optimum level conversion in the level converting part.

<7. Seventh Embodiment>

Figure 10:
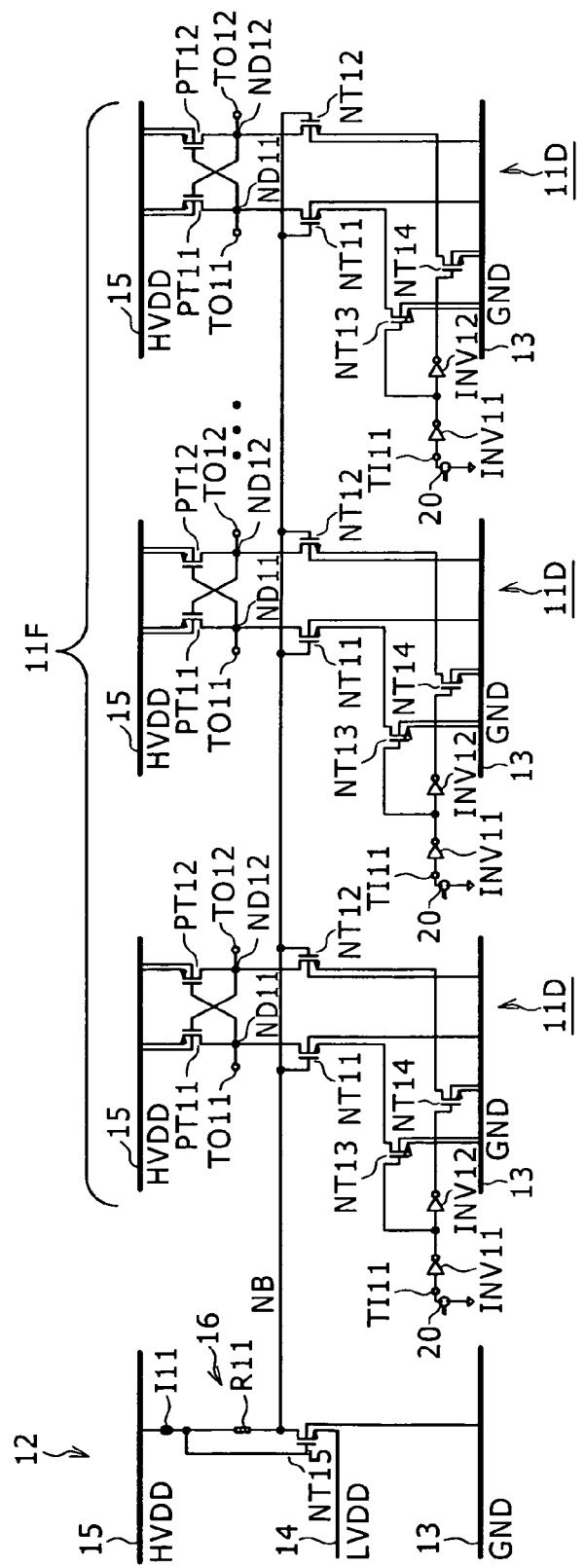
FIG. 10 is a circuit diagram showing a configuration example of a level converting circuit according to a seventh embodiment of the present disclosure.

FIG. 10 is a circuit diagram showing a configuration example of a level converting circuit according to a seventh embodiment of the present disclosure.

A level converting circuit 10F according to the seventh embodiment is different from the level converting circuit 10D according to the fifth embodiment in that plural level converting parts are connected in parallel to the supply line of the bias voltage NB from one bias part 12.

In the seventh embodiment, the other configuration is the same as that in the above-described fifth embodiment.

The seventh embodiment can achieve the same advantageous effects as those of the above-described first and fifth embodiments, and can prevent the flow of a steady current in the level converting part that is not operating when another level converting part is turned on.

Although the level converting part of the fifth embodiment is employed in the seventh embodiment, it is also possible to employ the level converting part with the configuration of another embodiment.

<8. Configuration Example of Display Device>

Figure 11:
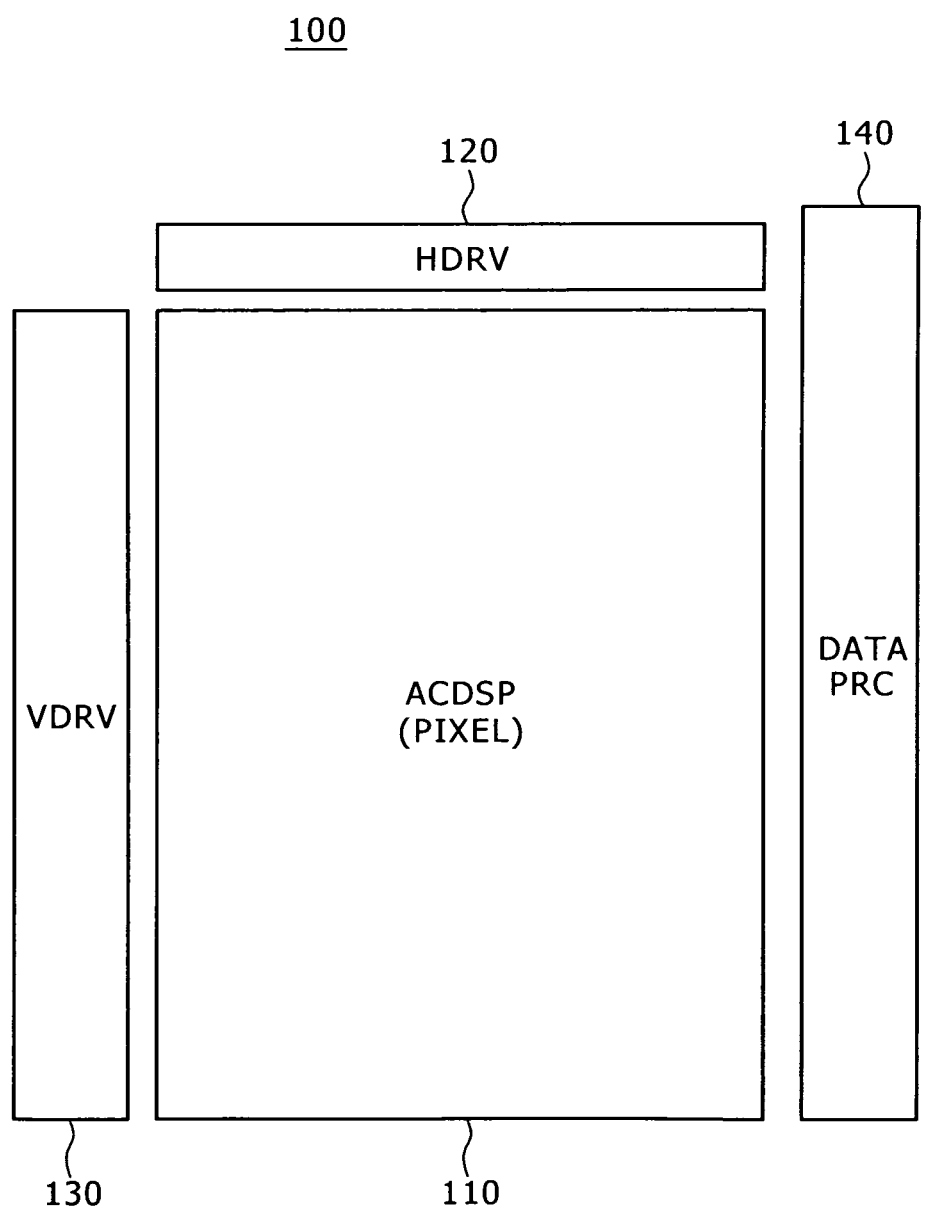
FIG. 11 is a diagram showing a configuration example of a display device according to an embodiment of the present disclosure.

FIG. 11 is a diagram showing a configuration example of a display device according to an embodiment of the present disclosure.

The configuration example will be described by taking as an example the case of application to an active-matrix liquid crystal display device in which liquid crystal cells are used as electrooptical elements of the respective pixels.

As shown in FIG. 11, this liquid crystal display device 100 has an effective display part (ACDSP) 110 obtained by disposing plural pixels including the liquid crystal cells in a matrix manner over a transparent insulating substrate such as a glass substrate.

The liquid crystal display device 100 has a signal line drive circuit (horizontal drive circuit, source driver: HDRV) 120 for driving signal lines.

The liquid crystal display device 100 has a gate line drive circuit (vertical drive circuit, gate driver: VDRV) 130 that drives gate lines (scan lines) for scanning and selecting the liquid crystal cells, and a data processing circuit (DATAPRC) 140.

The configurations and functions of the respective constituent elements in the liquid crystal display device 100 of the present embodiment will be sequentially described below.

In the effective display part (hereinafter, referred to simply as the display part) 110, the plural pixels including the liquid crystal cells are arranged in a matrix.

Furthermore, in the display part 110, the signal lines (data lines) and the gate lines (vertical scan lines) driven by the signal line drive circuit 120 and the gate line drive circuit 130 are wired in a matrix manner (lattice manner).

Figure 12:
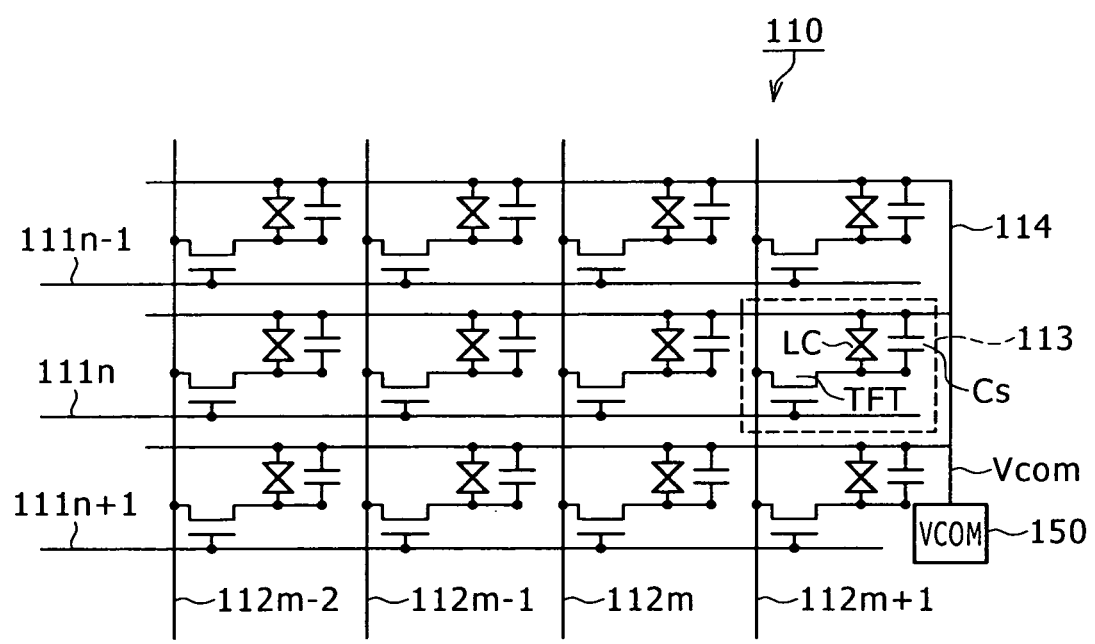
FIG. 12 is a circuit diagram showing a configuration example of an effective display part of a liquid crystal display device.

FIG. 12 is a diagram showing one example of the specific configuration of the display part 110.

In FIG. 12, a pixel arrangement of three rows (n−1-th row to n+1-th row) and four columns (m−2-th column to m+1-th column) is shown as an example for simplification of the diagram.

Referring to FIG. 12, in the display part 110, the gate lines (vertical scan lines) . . . , 111n−1, 111n, 111n+1, . . . and the signal lines (data lines) . . . , 112m−2, 112m−1, 112m, 112m+1, . . . are wired in a matrix manner. Unit pixels 113 are disposed at the intersections of the gate lines and the signal lines.

The unit pixel 113 has a thin film transistor TFT as a pixel transistor, a liquid crystal cell LC, and holding capacitance Cs.

The liquid crystal cell LC means the capacitance generated between a pixel electrode formed by the thin film transistor TFT (one electrode) and a counter electrode formed opposed to it (the other electrode).

The gate electrodes of the thin film transistors TFT are connected to the gate lines (vertical scan lines), . . . 111n−1, 111n, 111n+1, . . . , and the source electrodes are connected to the signal lines . . . , 112m−2, 112m−1, 112m, 112m+1 . . . .

The pixel electrode of the liquid crystal cell LC is connected to the drain electrode of the thin film transistor TFT and the counter electrode is connected to a common line 114. The holding capacitance Cs is connected between the drain electrode of the thin film transistor TFT and the common line 114.

A predetermined AC voltage is given as a common voltage Vcom to the common line 114 by a common voltage supply circuit (VCOM circuit) 150.

One end of each of the gate lines (vertical scan lines) . . . , 111n−1, 111n, 111n+1, . . . is connected to a respective one of the output terminals of the gate line drive circuit 130 shown in FIG. 11 on the corresponding row.

The gate line drive circuit 130 includes e.g. a shift register. It sequentially generates a vertical selection pulse in synchronization with a vertical transfer clock VCK (not shown) and gives the pulse to the gate lines (vertical scan lines) . . . , 111n−1, 111n, 111n+1, . . . to thereby perform vertical scanning.

Furthermore, in the display part 110, for example one end of each of the signal lines . . . , 112m−2, 112m−1, 112m, 112m+1, . . . is connected to a respective one of the output terminals of the signal line drive circuit 120 shown in FIG. 11 on the corresponding column.

The signal line drive circuit 120 has functions to convert drive data for driving the signal line shifted to the level corresponding to the drive level from digital data to analog data depending on the grayscale voltage and amplify the analog drive data to generate a signal voltage of the positive polarity and a signal voltage of the negative polarity.

Furthermore, the signal line drive circuit 120 has a function to selectively supply the signal voltage of the positive polarity and the signal voltage of the negative polarity to the signal lines adjacent to each other.

The data processing circuit 140 includes a level shifter (level converting part) that shifts e.g. the level of parallel data input from the external to a predetermined level.

The data processing circuit 140 includes a serial-parallel converter that converts the level-shifted data from serial data to parallel data for phase adjustment and frequency lowering, and outputs the parallel data to the signal line drive circuit 120.

The configuration and functions of the signal line drive circuit 120 according to the present embodiment will be specifically described below.

<9. Configuration Example of Signal Line Drive Circuit>

Figure 13:
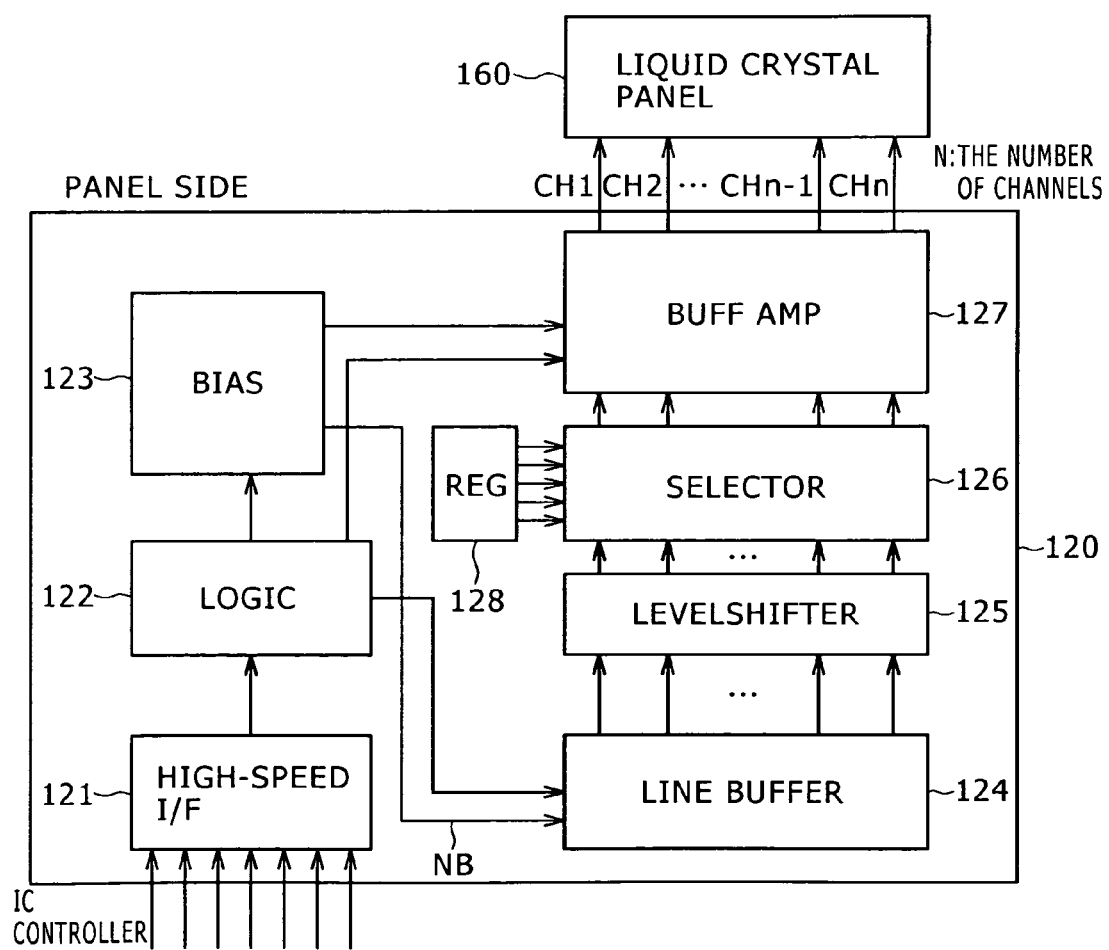
FIG. 13 is a block diagram showing a configuration example of a signal line drive circuit according to the embodiment.

FIG. 13 is a block diagram showing a configuration example of the signal line drive circuit according to the present embodiment.

The signal line drive circuit 120 shown in FIG. 13 has a high-speed interface part (I/F) 121, a logic circuit 122, and a bias part 123.

The signal line drive circuit 120 has a line buffer 124, a level shifter 125, a selector 126, a buffer amplifier 127, and a register 128.

The output buffer is configured by the buffer amplifier 127.

In the signal line drive circuit 120, the level converting circuits 10, 10A to 10F according to the first to seventh embodiments can be used.

For example, any of the bias parts 12 in the level converting circuits according to the first to seventh embodiments is used as part of the bias part 123, and any of the level converting parts 11 in the level converting circuits according to the first to seventh embodiments is used as the level shifter 125.

It is preferable to employ a configuration in which plural level converting parts are connected in parallel to one bias part 12 like the seventh embodiment.

The logic circuit 122 converts serial data input by the high-speed interface part 121 to parallel data, and supplies the converted data as drive data to the line buffer 124.

The logic circuit 122 controls the bias state of the output-stage amplifier of the buffer amplifier 127.

The bias part 123 selectively outputs a bias signal of the output-stage amplifier to the buffer amplifier 127 under control by the logic circuit 122.

The line buffer 124 stores the drive data, which results from the serial-parallel conversion by the logic circuit 122 and is for driving the signal line.

The level shifter 125 converts the level of the data of the line buffer 124 to the level depending on the drive level.

The signal level of the data of the line buffer 124 is the levels of the reference voltage (ground level) and the first voltage (low supply voltage LVDD).

The level shifter 125 receives supply of the bias voltage NB by the bias part 123 to convert the input signal level to the signal level of the second voltage (high supply voltage HVDD) higher than the reference voltage and the first voltage.

As described above, in the present embodiment, as one example, the reference voltage is e.g. the ground potential GND (0 V). The first voltage is the low supply voltage LVDD, e.g. 1.8 V. The second voltage is the high supply voltage HVDD, e.g. 18 V.

The selector 126 includes plural digital-analog converters (DAC) that receive the grayscale voltage held in the register 128 and convert the drive data from digital data to analog data.

The buffer amplifier 127 as the output buffer amplifies the drive data output from the selector 126 and generates the signal voltage of the positive polarity and the signal voltage of the negative polarity.

The buffer amplifier 127 selectively supplies the signal voltage of the positive polarity and the signal voltage of the negative polarity to the adjacent signal lines that are wired on a liquid crystal panel 160 and make a pair.

Actually, the number n of channels of the buffer amplifier 127 is 100 or more, and the signal lines corresponding to these channels are driven.

The above embodiment is described by taking as an example the case of application to an active-matrix liquid crystal display device. However, embodiments of the present disclosure are not limited thereto. For example, embodiments of the present disclosure can be similarly applied also to other active-matrix display devices such as an EL display device in which electroluminescence (EL) elements are used as electrooptical elements of the respective pixels.

Furthermore, embodiments of the present disclosure can be similarly applied also to passive display devices.

<10. Configuration Example of Electronic Apparatus>

The active-matrix display device typified by the active-matrix liquid crystal display device according to the above-described embodiment can be applied to various pieces of electronic apparatus.

That is, the active-matrix display device can be applied to a display device in electronic apparatus of all fields that displays a video signal input to the electronic apparatus or a video signal generated in the electronic apparatus as image or video.

Examples of the electronic apparatus include digital camera, notebook personal computer, portable terminal device (mobile apparatus) such as a cellular phone, desktop personal computer, and video camcorder.

One example of the electronic apparatus to which the present embodiment is applied will be described below.

Figure 14:
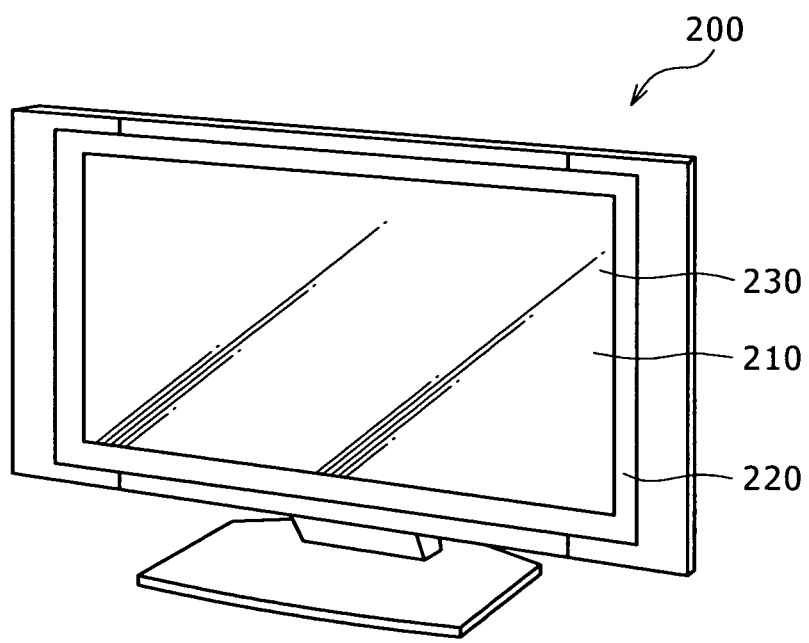
FIG. 14 is a perspective view showing a television to which the embodiment is applied.

FIG. 14 is a perspective view showing a television to which the present embodiment is applied.

A television 200 according to the present application example includes a video display screen part 210 composed of a front panel 220, a filter glass 230, and so forth, and is fabricated by using the display device according to the present embodiment as the video display screen part 210.

Figure 15A:
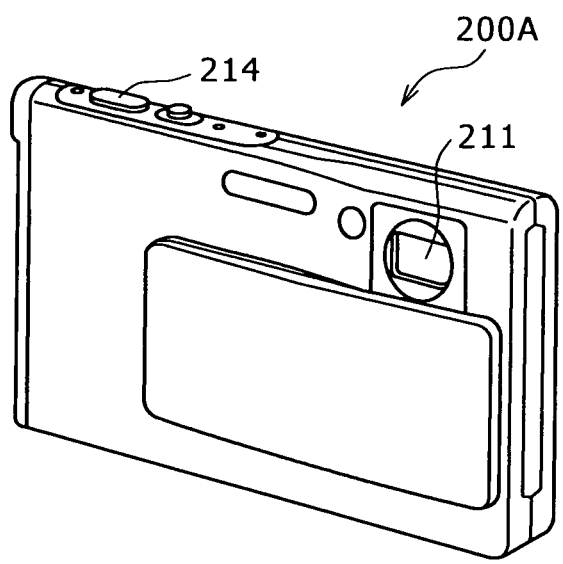
FIGS. 15A and 15B are perspective views showing a digital camera to which the embodiment is applied.
Figure 15B:
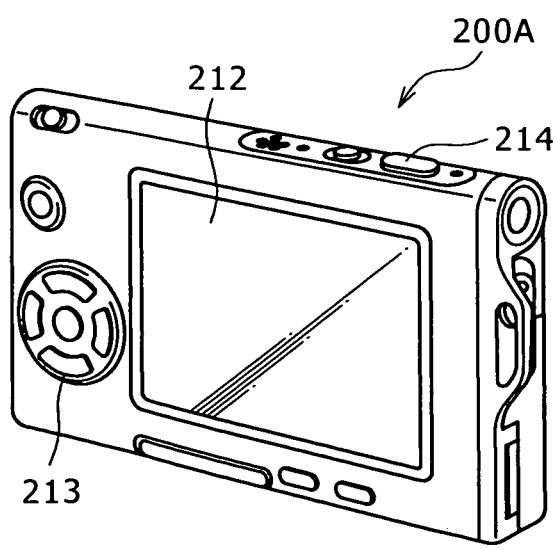

FIGS. 15A and 15B are perspective views showing a digital camera to which the present embodiment is applied. FIG. 15A is a perspective view seen from the front side, and FIG. 15B is a perspective view seen from the back side.

A digital camera 200A according to the present application example includes a light emitter 211 for flash, a display part 212, a menu switch 213, a shutter button 214, and so forth, and is fabricated by using the display device according to the present embodiment as the display part 212.

Figure 16:
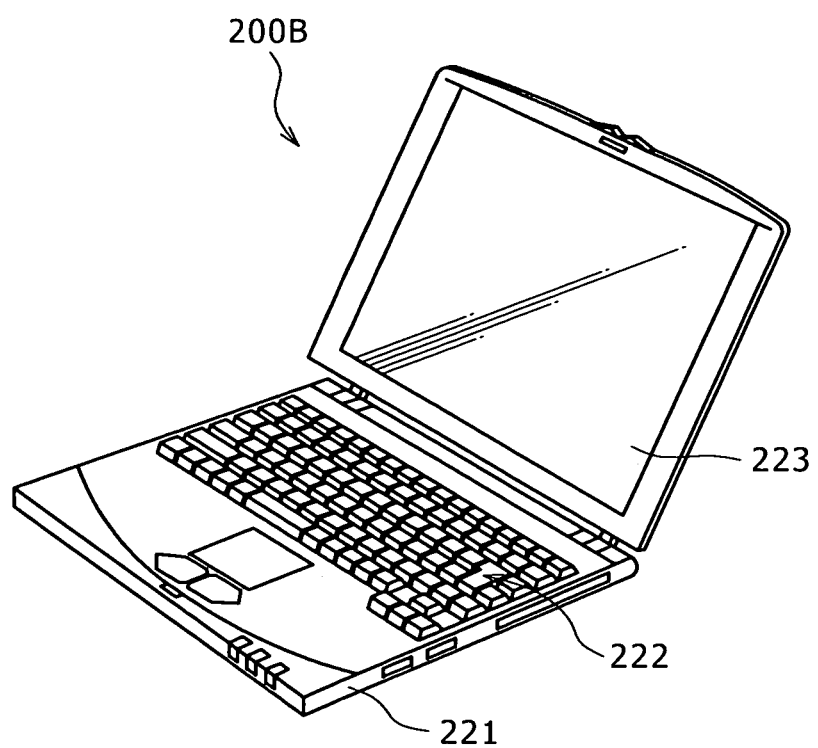
FIG. 16 is a perspective view showing a notebook personal computer to which the embodiment is applied.

FIG. 16 is a perspective view showing a notebook personal computer to which the present embodiment is applied.

A notebook personal computer 200B according to the present application example includes, in its main body 221, a keyboard 222 operated when characters etc. are input, a display part 223 that displays an image, and so forth, and is fabricated by using the display device according to the present embodiment as the display part 223.

Figure 17:
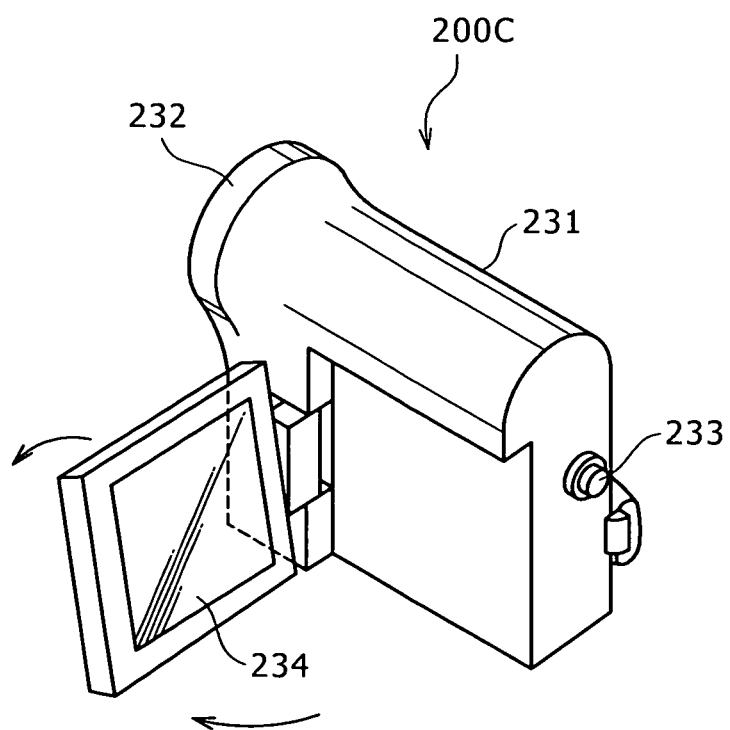
FIG. 17 is a perspective view showing a video camcorder to which the embodiment is applied.

FIG. 17 is a perspective view showing a video camcorder to which the present embodiment is applied.

A video camcorder 200C according to the present application example includes a main body part 231, a lens 232 that is disposed on the front side and used for object photographing, a start/stop switch 233 about photographing, a display part 234, and so forth, and is fabricated by using the display device according to the present embodiment as the display part 234.

FIGS. 18A to 18G are portable terminal devices to which the present embodiment is applied, specifically e.g. a cellular phone. FIG. 18A is a front view of the opened state and FIG. 18B is a side view of the opened state. FIG. 18C is a front view of the closed state. FIG. 18D is a left side view and FIG. 18E is a right side view. FIG. 18F is a top view, and FIG. 18G is a bottom view.

A cellular phone 200D according to the present application example includes an upper chassis 241, a lower chassis 242, a connection part (hinge part, in this example) 243, a display 244, a sub-display 245, a picture light 246, a camera 247, and so forth.

The cellular phone 200D is fabricated by using the display device according to the present embodiment as the display 244 and the sub-display 245.

The present disclosure contains subject matter related to that disclosed in Japanese Priority Patent Application JP 2010-228896 filed in the Japan Patent Office on Oct. 8, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A level converting circuit comprising:
   a level converting part configured to receive supply of a bias voltage and convert an input signal whose signal level is levels of a reference voltage and a first voltage to a signal level of a second voltage higher than the reference voltage and the first voltage; and
   a bias part configured to generate the bias voltage and supply the bias voltage to the level converting part,
   wherein
   the level converting part includes at least a first n-type field effect transistor, a second n-type field effect transistor, a third n-type field effect transistor, a fourth n-type field effect transistor, a first p-type field effect transistor, and a second p-type field effect transistor,
   a drain of the first n-type field effect transistor is connected to a drain of the first p-type field effect transistor and a gate of the second p-type field effect transistor, and the first n-type field effect transistor has a source connected to a drain of the third n-type field effect transistor and has a gate connected to a supply source of the bias voltage,
   a drain of the second n-type field effect transistor is connected to a drain of the second p-type field effect transistor and a gate of the first p-type field effect transistor, and the second n-type field effect transistor has a source connected to a drain of the fourth n-type field effect transistor and has a gate connected to the supply source of the bias voltage,
   a source of the first p-type field effect transistor and a source of the second p-type field effect transistor are connected to a second voltage source,
   a source of the third n-type field effect transistor and a source of the fourth n-type field effect transistor are connected to a reference voltage source,
   an input signal that takes a reference voltage level and a first voltage level in a complementary manner is supplied to a gate of the third n-type field effect transistor and a gate of the fourth n-type field effect transistor,
   the bias part includes a fifth n-type field effect transistor, a voltage drop part including at least one resistive element, and a current source having a power-supply-side terminal connected to a voltage source of a voltage higher than the first voltage, the fifth n-type field effect transistor has a source connected to a first voltage source and has a drain connected to one end of the resistive element, the other end of the resistive element is connected to a current supply terminal side of the current source, a gate of the fifth n-type field effect transistor is connected to a side of the other end of the resistive element, and the bias part generates the bias voltage higher than the first voltage by threshold voltage of the first n-type field effect transistor and the second n-type field effect transistor or the bias voltage that is higher than the first voltage and lower than the threshold voltage at a side of one end of the resistive element, and supplies the bias voltage to the gate of the first n-type field effect transistor and the gate of the second n-type field effect transistor in the level converting part.

2. The level converting circuit according to claim 1, wherein a voltage dropped by the resistive element of the voltage drop part is a voltage capable of cancelling out a generated overdrive voltage.

3. The level converting circuit according to claim 1, wherein the level converting part further includes a third p-type field effect transistor and a fourth p-type field effect transistor, the third p-type field effect transistor has a drain connected to the drain of the third n-type field effect transistor and has a source connected to the first voltage source, and the input signal at a signal level supplied to the gate of the third n-type field effect transistor is supplied to a gate of the third p-type field effect transistor, and the fourth p-type field effect transistor has a drain connected to the drain of the fourth n-type field effect transistor and has a source connected to the first voltage source, and the input signal at a signal level supplied to the gate of the fourth n-type field effect transistor is supplied to a gate of the fourth p-type field effect transistor.

4. The level converting circuit according to claim 1, wherein a plurality of resistive elements are connected in series in the voltage drop part, and in the bias part, any of a plurality of nodes formed by a connection node between the side of one end of the resistive element and the drain of the fifth n-type field effect transistor and connection nodes among the resistive elements connected in series is formed as an output node of the bias voltage obtained by resistor division.

5. The level converting circuit according to claim 4, further comprising a selector configured to select any of a plurality of bias voltages output from the plurality of nodes and supply the selected bias voltage to the gate of the first n-type field effect transistor and the gate of the second n-type field effect transistor in the level converting part.

6. The level converting circuit according to claim 5, wherein a buffer is connected to an output side of the selector.

7. The level converting circuit according to claim 1, wherein the level converting part includes a fifth p-type field effect transistor and a sixth p-type field effect transistor, the fifth p-type field effect transistor has a drain connected to the drain of the first n-type field effect transistor and has a source connected to the drain of the first p-type field effect transistor, the sixth p-type field effect transistor has a drain connected to the drain of the second n-type field effect transistor and has a source connected to the drain of the second p-type field effect transistor, and a predetermined bias voltage is supplied to a gate of the fifth p-type field effect transistor and a gate of the sixth p-type field effect transistor.

8. The level converting circuit according to claim 1, wherein a plurality of level converting parts are connected in parallel to a supply line of the bias voltage of one bias part.

9. A display device comprising:

a display part configured to have display cells disposed in a matrix manner; and a signal line drive circuit configured to include a level converting circuit that converts an input signal to a level depending on a drive level and drive a signal line connected to the display cell by a drive signal generated by using a level-converted signal, wherein the level converting circuit in the signal line drive circuit includes at least one level converting part that receives supply of a bias voltage and converts an input signal whose signal level is levels of a reference voltage and a first voltage to a signal level of a second voltage higher than the reference voltage and the first voltage, and a bias part that generates the bias voltage and supplies the bias voltage to the level converting part, the level converting part includes at least a first n-type field effect transistor, a second n-type field effect transistor, a third n-type field effect transistor, a fourth n-type field effect transistor, a first p-type field effect transistor, and a second p-type field effect transistor, a drain of the first n-type field effect transistor is connected to a drain of the first p-type field effect transistor and a gate of the second p-type field effect transistor, and the first n-type field effect transistor has a source connected to a drain of the third n-type field effect transistor and has a gate connected to a supply source of the bias voltage, a drain of the second n-type field effect transistor is connected to a drain of the second p-type field effect transistor and a gate of the first p-type field effect transistor, and the second n-type field effect transistor has a source connected to a drain of the fourth n-type field effect transistor and has a gate connected to the supply source of the bias voltage, a source of the first p-type field effect transistor and a source of the second p-type field effect transistor are connected to a second voltage source, a source of the third n-type field effect transistor and a source of the fourth n-type field effect transistor are connected to a reference voltage source, an input signal that takes a reference voltage level and a first voltage level in a complementary manner is supplied to a gate of the third n-type field effect transistor and a gate of the fourth n-type field effect transistor, the bias part includes a fifth n-type field effect transistor, a voltage drop part including at least one resistive element, and a current source having a power-supply-side terminal connected to a voltage source of a voltage higher than the first voltage, the fifth n-type field effect transistor has a source connected to a first voltage source and has a drain connected to one end of the resistive element, the other end of the resistive element is connected to a current supply terminal side of the current source, a gate of the fifth n-type field effect transistor is connected to a side of the other end of the resistive element, and the bias part generates the bias voltage higher than the first voltage by threshold voltage of the first n-type field effect transistor and the second n-type field effect transistor or the bias voltage that is higher than the first voltage and lower than the threshold voltage at a side of one end of the resistive element, and supplies the bias voltage to the gate of the first n-type field effect transistor and the gate of the second n-type field effect transistor in the level converting part.

10. The display device according to claim 9, wherein a voltage dropped by the resistive element of the voltage drop part is a voltage capable of cancelling out a generated overdrive voltage.

11. The display device according to claim 9, wherein the level converting part further includes a third p-type field effect transistor and a fourth p-type field effect transistor, the third p-type field effect transistor has a drain connected to the drain of the third n-type field effect transistor and has a source connected to the first voltage source, and the input signal at a signal level supplied to the gate of the third n-type field effect transistor is supplied to a gate of the third p-type field effect transistor, and the fourth p-type field effect transistor has a drain connected to the drain of the fourth n-type field effect transistor and has a source connected to the first voltage source, and the input signal at a signal level supplied to the gate of the fourth n-type field effect transistor is supplied to a gate of the fourth p-type field effect transistor.

12. The display device according to claim 9, wherein a plurality of resistive elements are connected in series in the voltage drop part, and in the bias part, any of a plurality of nodes formed by a connection node between the side of one end of the resistive element and the drain of the fifth n-type field effect transistor and connection nodes among the resistive elements connected in series is formed as an output node of the bias voltage obtained by resistor division.

13. The display device according to claim 12, wherein the level converting circuit includes a selector that selects any of a plurality of bias voltages output from the plurality of nodes and supplies the selected bias voltage to the gate of the first n-type field effect transistor and the gate of the second n-type field effect transistor in the level converting part.

14. The display device according to claim 13, wherein a buffer is connected to an output side of the selector.

15. The display device according to claim 9, wherein the level converting part includes a fifth p-type field effect transistor and a sixth p-type field effect transistor, the fifth p-type field effect transistor has a drain connected to the drain of the first n-type field effect transistor and has a source connected to the drain of the first p-type field effect transistor, the sixth p-type field effect transistor has a drain connected to the drain of the second n-type field effect transistor and has a source connected to the drain of the second p-type field effect transistor, and a predetermined bias voltage is supplied to a gate of the fifth p-type field effect transistor and a gate of the sixth p-type field effect transistor.

16. The display device according to claim 9, wherein a plurality of level converting parts are connected in parallel to a supply line of the bias voltage of one bias part.

17. An electronic apparatus having a display device, the display device comprising:

a display part configured to have display cells disposed in a matrix manner; and a signal line drive circuit configured to include a level converting circuit that converts an input signal to a level depending on a drive level and drive a signal line connected to the display cell by a drive signal generated by using a level-converted signal, wherein the level converting circuit in the signal line drive circuit includes at least one level converting part that receives supply of a bias voltage and converts an input signal whose signal level is levels of a reference voltage and a first voltage to a signal level of a second voltage higher than the reference voltage and the first voltage, and a bias part that generates the bias voltage and supplies the bias voltage to the level converting part, the level converting part includes at least a first n-type field effect transistor, a second n-type field effect transistor, a third n-type field effect transistor, a fourth n-type field effect transistor, a first p-type field effect transistor, and a second p-type field effect transistor, a drain of the first n-type field effect transistor is connected to a drain of the first p-type field effect transistor and a gate of the second p-type field effect transistor, and the first n-type field effect transistor has a source connected to a drain of the third n-type field effect transistor and has a gate connected to a supply source of the bias voltage, a drain of the second n-type field effect transistor is connected to a drain of the second p-type field effect transistor and a gate of the first p-type field effect transistor, and the second n-type field effect transistor has a source connected to a drain of the fourth n-type field effect transistor and has a gate connected to the supply source of the bias voltage, a source of the first p-type field effect transistor and a source of the second p-type field effect transistor are connected to a second voltage source, a source of the third n-type field effect transistor and a source of the fourth n-type field effect transistor are connected to a reference voltage source, an input signal that takes a reference voltage level and a first voltage level in a complementary manner is supplied to a gate of the third n-type field effect transistor and a gate of the fourth n-type field effect transistor, the bias part includes a fifth n-type field effect transistor, a voltage drop part including at least one resistive element, and a current source having a power-supply-side terminal connected to a voltage source of a voltage higher than the first voltage, the fifth n-type field effect transistor has a source connected to a first voltage source and has a drain connected to one end of the resistive element, the other end of the resistive element is connected to a current supply terminal side of the current source, a gate of the fifth n-type field effect transistor is connected to a side of the other end of the resistive element, and the bias part generates the bias voltage higher than the first voltage by threshold voltage of the first n-type field effect transistor and the second n-type field effect transistor or the bias voltage that is higher than the first voltage and lower than the threshold voltage at a side of one end of the resistive element, and supplies the bias voltage to the gate of the first n-type field effect transistor and the gate of the second n-type field effect transistor in the level converting part.

* * * * *